(12) United States Patent
Tonegawa et al.

(10) Patent No.: US 7,563,705 B2
(45) Date of Patent: Jul. 21, 2009

(54) MANUFACTURING METHOD OF SEMICONDUCTOR DEVICE

(75) Inventors: Takashi Tonegawa, Kanagawa (JP); Koji Arita, Kanagawa (JP); Tatsuya Usami, Kanagawa (JP); Noboru Morita, Kanagawa (JP); Koichi Ohto, Kanagawa (JP); Yoichi Sasaki, Kanagawa (JP); Sadayuki Ohnishi, Kanagawa (JP); Ryohei Kitao, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 513 days.

(21) Appl. No.: 11/359,393

(22) Filed: Feb. 23, 2006

(65) Prior Publication Data

US 2006/0141778 A1   Jun. 29, 2006

Related U.S. Application Data

(62) Division of application No. 10/365,437, filed on Feb. 13, 2003, now abandoned.

(30) Foreign Application Priority Data

Feb. 14, 2002   (JP)   ............... 2002-036312

(51) Int. Cl.
    *H01L 21/4763*   (2006.01)
(52) U.S. Cl. ............... 438/622; 438/627; 438/637; 438/643
(58) Field of Classification Search ......... 438/622, 438/626, 627, 633, 637, 638, 643, 645, 653, 438/687, 789
    See application file for complete search history.

(56) References Cited

U.S. PATENT DOCUMENTS 6,028,015 A   2/2000   Wang et al.
6,479,884 B2   11/2002   Cook et al.

(Continued)

FOREIGN PATENT DOCUMENTS

JP   10-284600 A   10/1998

(Continued)

OTHER PUBLICATIONS

Taiwanese Office Action (with English translation) dated May 25, 2005.

(Continued)

*Primary Examiner*—Kevin M Picardat
(74) *Attorney, Agent, or Firm*—Sughrue Mion, PLLC

(57) ABSTRACT

A manufacturing method of a semiconductor device including a step of forming a via hole in an insulation layer including an organic low dielectric film, such as MSQ, SiC, and SiCN, and then embedding a wiring material in the via hole through a barrier metal. According to this method, a plasma treatment is performed after the via hole is formed and before the barrier metal is deposited, using a He/$H_2$ gas capable of replacing groups (methyl groups) made of organic constituents and covering the surface of the exposed organic low dielectric film (MSQ) with hydrogen, or a He gas capable decomposing the groups (methyl groups) without removing organic low dielectric molecules. As a result, the surface of the low dielectric film (MSQ) is reformed to be hydrophilic and adhesion to the barrier metal is hence improved, thereby making it possible to prevent the occurrence of separation of the barrier metal and scratches.

9 Claims, 21 Drawing Sheets

U.S. PATENT DOCUMENTS

| | | |
|---|---|---|
| 6,518,166 B1 | 2/2003 | Chen et al. |
| 6,531,389 B1 | 3/2003 | Shue et al. |
| 6,723,634 B1 | 4/2004 | Ngo et al. |
| 6,759,098 B2 * | 7/2004 | Han et al. .................. 438/789 |
| 2002/0197852 A1 | 12/2002 | Yeh et al. |

FOREIGN PATENT DOCUMENTS

| | | |
|---|---|---|
| JP | 2001-168075 A | 6/2001 |
| JP | 2001-223269 A | 8/2001 |
| JP | 2001-168075 | 2/2002 |
| JP | 2002-118112 A | 4/2002 |
| JP | 2002-203852 A | 7/2002 |
| TW | 466735 | 12/2001 |
| WO | 01/71801 A1 | 9/2001 |

OTHER PUBLICATIONS

Edelstein, D. et al., "A High Performance Liner for Copper Damascene Interconnects", IEEE, 2001, pp. 9-11.

Liu, P. T. et al., "Enhancing the Oxygen Plasma Resistance of Low-$k$ Methylsilsesquioxane by $H_2$ Plasma Treatment", Jpn. J. Appl. Phys., vol. 38, 1999, pp. 3482-3486 (http://jjap.ipap.jp/link?JJAP/38/3482/).

Hiroi, M. et al. "Dual Hard Mask Process for low-k Porous Organosilica Dielectric in Copper Dual Damascene Interconnect Fabrication". IEEE, pp. 295-297. (2001).

Xiao, Hong. "Introduction to semiconductor manufacturing technology", Ch. 11, pp. 494-496 (2001).

* cited by examiner

F I G. 7A
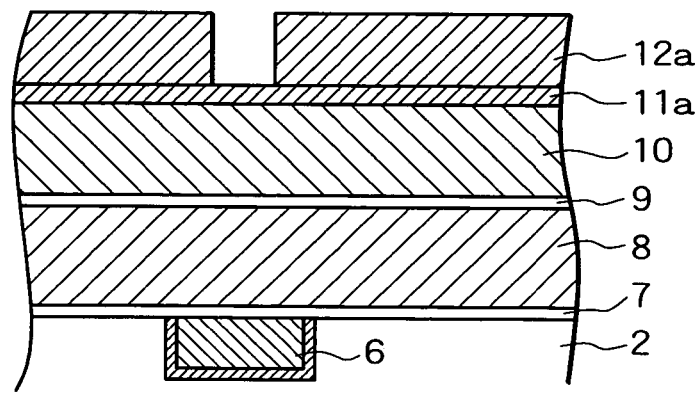
F I G. 7B
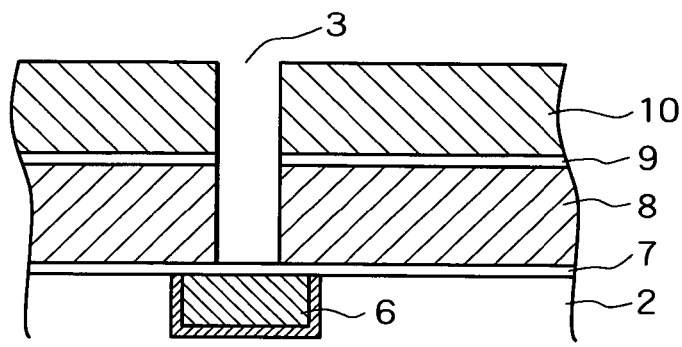
F I G. 7C
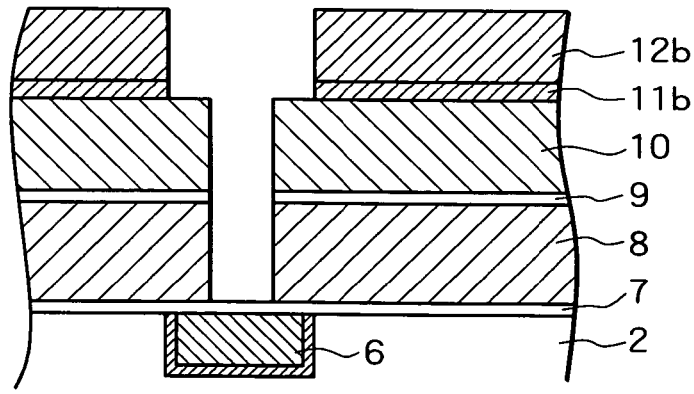

F I G. 14A
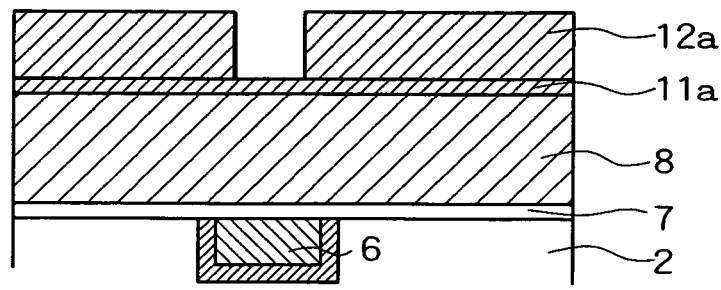
F I G. 14B
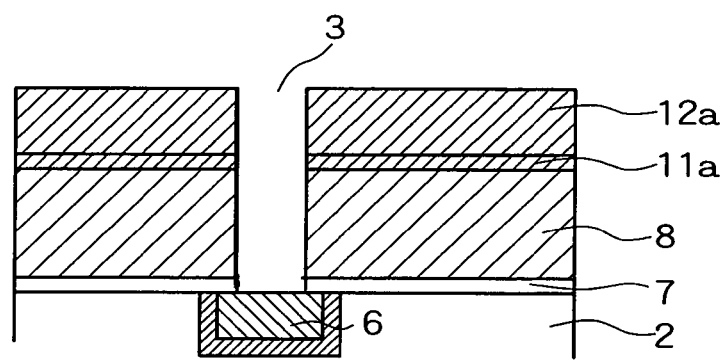
F I G. 14C
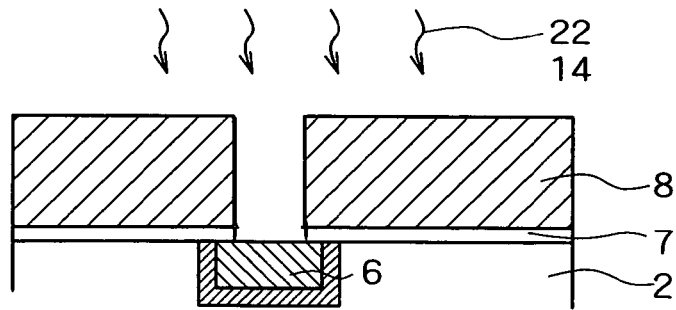

MANUFACTURING METHOD OF SEMICONDUCTOR DEVICE

This is a divisional of application Ser. No. 10/365,437 filed Feb. 13, 2003 now abandoned. The entire disclosure of the prior application, application Ser. No. 10/365,437 is hereby incorporated by reference

BACKGROUND OF THE INVENTION

1. Field of the Invention

The present invention relates to a structure of a semiconductor device and a manufacturing method thereof, and more particularly to, in a damascene process using a low dielectric film having a bond of Si and a group made of organic constituents, such as MSQ, an interface structure of a barrier metal and the low dielectric film and a surface treatment method thereof.

2. Description of the Related Art

To meet the high integration of a semiconductor device and a reduction in chip size in recent years, not only the miniaturization of the wiring, but also the multi-level interconnection is being promoted. As a method of forming a multi-level interconnect structure, a so-called damascene process is generally performed, by which an interconnect is formed by embedding Cu in both a via hole and a wiring trench pattern concurrently followed by planarization through the CMP (Chemical Mechanical Polishing) method. The damascene process can increase density of wiring patterns; however, when the wiring patterns are formed too close, a parasitic capacitance between the wiring patterns causes problematic interconnect delay. Hence, a reduction in interconnect capacitance becomes an issue of great importance to improve the interconnect delay.

In order to reduce the interconnect capacitance, there has been discussed a method of using a low dielectric material for the interlayer insulation film instead of a conventionally used $SiO_2$-based insulation film. The conventional damascene process using a low dielectric film as the interlayer insulation film will now be explained with reference to the accompanying drawings. FIG. 1A through FIG. 3B are cross sections showing the step-by-step sequence of a via first process, which is one embodiment of the conventional damascene process.

Initially, as shown in FIG. 1A, a first etching stopper film 7 to be used as an etching stopper for a via hole by preventing diffusion of Cu, a first interlayer insulation film 8 made of $SiO_2$, a second etching stopper film 9 to be used as an etching stopper for a wiring trench pattern, and a second interlayer insulation film 18 of a low dielectric film, such as hydrogen silsesquioxane (hereinafter, abbreviated to HSQ) and methyl silsesquioxane (hereinafter, abbreviated to MSQ), are deposited sequentially from bottom to top on a substrate 2 in which a lower layer wiring 6 made of Cu has been formed. Subsequently, after a first reflection preventing film 11a is formed on the second interlayer insulation film 18, photoresist is applied thereon, which is subjected to exposure and development. A first resist pattern 12a to be used to form a via hole 3 is thereby formed.

Then, as shown in FIG. 1B, the first reflection preventing film 11a, the second interlayer insulation film 18, the second etching stopper film 9, and the first interlayer insulation film 8 are etched away sequentially through a known dry etching technique, using the first resist pattern 12a as a mask. A via hole 3 penetrating through these films is thereby formed.

Then, after the first resist pattern 12a and the first reflection preventing film 11a are removed, as shown in FIG. 1C, a second reflection preventing film 11b is formed and then photoresist is applied thereon, which is subjected to exposure and development. A second resist pattern 12b to be used to form a wiring trench pattern through etching is thereby formed. Subsequently, the second reflection preventing film 11b and the second interlayer insulation film 18 are etched away sequentially through a known dry etching technique, and a wiring trench pattern 13 is thereby formed (see FIG. 2A).

Then, as shown in FIG. 2B, the first etching stopper film 7 atop the lower layer wiring 6 is removed, after which, as shown in FIG. 2C, a barrier metal 4 to be used as a base layer for a wiring material is formed. Then, a wiring material 5, such as Cu, is embedded in the interiors of the wiring trench pattern 13 and the via hole 3, and the surface thereof is planarized through CMP (see FIG. 3A and FIG. 3B). A dual damascene structure is thus obtained.

In the conventional damascene process described above, when HSQ is used as the second interlayer insulation film 18, because HQS is an inorganic low dielectric film, it adheres well to a barrier metal, a silicon oxide film, and a silicon nitride film, which are also made of inorganic materials, and there occurs no problem that these inorganic materials are separated at the HSQ interface.

However, when a low dielectric film having a bond of Si and a group made of organic constituents, such as MSQ, is used as the second interlayer insulation film 18, it does not adhere well to an inorganic material, particularly, a barrier metal, and as shown in FIG. 3B, the barrier metal is separated from an MSQ-based low dielectric film during CMP, which gives rise to a problematic scratch 21 on the surface of the MSQ-based low dielectric film, or stress caused by the multi-level interconnection gives rise to problematic film separation 20 at the barrier metal/MSQ interface having poor adhesion. It should be noted, however, that the MSQ-based low dielectric film has a lower dielectric constant than HSQ, and is therefore expected as a promising next-generation interlayer film, which increases the importance of solving the adhesion problem at the interface between the MSQ-based low dielectric film and the barrier metal.

The reason why HSQ and MSQ have different adhesion to the barrier metal 4 as described above is attributed to the difference as follows: HSQ has a structure in which oxygen and hydrogen are bonded to silicon atoms, whereas MSQ contains organic constituents having a large molecular structure, such as a methyl group, in order to lower a dielectric constant, and the organic constituents at the MSQ interface interfere with bonding of Si and the barrier metal 4, such as tantalum (Ta) and tantalum nitride (TaN).

In order to prevent such unwanted separation, there has been discussed a structure that protects the groove sidewall after the groove is formed. For example, Japanese Patent Laid-Open Publication No. Hei. 10-284600 discloses a method of protecting the sidewall by providing a $Si_3N_4$ or $SiO_2$ sidewall to a groove pattern formed in the low dielectric interlayer film. This method, however, cannot avoid an increase in dielectric constant when a thick film is formed, and deterioration in adhesion associated with a pin-hole when a thin film is formed.

Also, in order to prevent separation due to poor adhesion as described above, there has been discussed a method of improving adhesion by applying various surface treatments to the surface of MSQ after it is deposited. For example, during the fabrication sequence of a semiconductor device, cleaning through sputtering using an Ar gas is performed in many steps as needed, and Ar sputtering is performed to clean the surface of the lower layer wiring 6 at the bottom of the via hole 3 after the wiring trench pattern 13 is formed and before the barrier metal 4 is deposited. However, because merely a sputtered material is etched away through Ar sputtering, it proves to be ineffective in reforming the MSQ surface.

Also, there has been discussed a method of performing an ozone treatment, a UV ozone treatment, or an oxygen plasma treatment after MSQ is deposited, and Japanese Patent Laid-Open Publication No. 2001-223269 discloses a method of reforming the surface of the interlayer insulation film to be a silicon oxide film or a silicon dioxide film containing excessive silicon through irradiation of a charged beam of an ionized oxygen gas. This method, however, has a problem that water comes into the film and a dielectric constant of the insulation film is increased; moreover, the surface of the film is made rough and a residue is left thereon.

As has been described, it is essential to use a low dielectric film containing organic constituents, such as MSQ, as an interlayer insulation film to reduce an interconnect capacitance. However, the reliability reduced by poor adhesion of the low dielectric film to an inorganic material, particularly, a barrier metal, poses a serious problem, and there has been a need to develop a structure capable of increasing adhesion of the low dielectric film to the barrier metal, and a process capable of reforming the surface of the low dielectric film. This problem is not limited to the via first dual damascene process described above, and can occur in any other damascene process, such as a dual hard mask process and a single damascene process, as well as in any other process using a low dielectric film having a bond of Si and a group made of organic constituents.

SUMMARY OF THE INVENTION

An object of the present invention is to provide a semiconductor device capable of improving adhesion of a low dielectric film having a bond of Si and a group made of organic constituents, such as MSQ, to a barrier metal at the interface in a damascene process and a manufacturing method thereof.

In particular, the object is to provide a structure of a semiconductor device capable of improving adhesion of the low dielectric interlayer film to an inorganic material, such as the barrier metal, by removing the organic constituents at the barrier metal/film interface, and a manufacturing method of the semiconductor device.

A semiconductor device according to the present invention comprises an insulation layer including a low dielectric film having a bond of Si and a group made of organic constituents, and a wiring material embedded, through a barrier metal, in one of a via hole and a wiring groove formed in said insulation layer. A layer is formed between the low dielectric film and the barrier metal and has a relatively low concentration of organic constituents in comparison with the low dielectric film.

It is preferable for the semiconductor device of the invention that a concentration of carbon (C) of the layer having the relatively low concentration of organic constituents in comparison with the low dielectric interlayer film is 7 atom % or below.

It is preferable for the semiconductor device of the invention that a concentration of carbon (C) of the layer having the relatively low concentration of organic constituents in comparison with the low dielectric interlayer film is 7 atom % or below and 2 atom % or above.

It is preferable for the semiconductor device of the invention that the layer having the relatively low concentration of organic constituents in comparison with the low dielectric interlayer film has a film thickness of 25 nm or less.

It is preferable for the semiconductor device of the invention that the layer having the relatively low concentration of organic constituents in comparison with the low dielectric interlayer film has a Si—H bond.

It is preferable for the semiconductor device of the invention that the low dielectric film is one of methyl silsesquioxane (MSQ), methylated hydrogen silsesquioxane (MHSQ), silicon carbide (SiC), silicon oxycarbide or carbon-doped glass (SiOC or SiCOH), organo sillicated grass (OSG), silicon carbonitride (SiCN), and a porous film of each.

It is preferable for the semiconductor device of the invention that the barrier metal is made of tantalum nitride (TaN) on a side of the low dielectric film and tantalum (Ta) on a side of the wiring material.

Also, according to a manufacturing method of a semiconductor device of the invention, in a manufacturing method of a semiconductor device including a step of embedding, through a barrier metal, a wiring material in one of a via hole and a wiring groove formed in an insulation layer including a low dielectric film having a bond of Si and a group made of organic constituents, a plasma treatment is performed before the barrier metal is deposited, using one of a gas capable of replacing at least part of the group made of organic constituents on an exposed surface of the low dielectric film with hydrogen, and a gas capable of decomposing at least part of the group made of organic constituents to form a dangling bond.

Also, according to a manufacturing method of a semiconductor device of the invention, in a manufacturing method of a semiconductor device including the steps of: forming at least a first interlayer insulation film and a second interlayer insulation film sequentially on a substrate in which a wiring pattern has been formed; forming a via hole penetrating through the first interlayer insulation film and the second interlayer insulation film using a first resist pattern formed on the second interlayer insulation film; removing the first resist pattern and then forming a trench pattern through etching of the second interlayer insulation film using a second resist pattern formed on the second interlayer insulation film; depositing a barrier metal on the second interlayer insulation film and on inner walls of the via hole and the trench pattern; depositing a wiring material and then embedding the wiring material in interiors of the via hole and the trench pattern; and removing extra portion of said wiring material and said barrier metal through CMP and surface is planarized, at least one of the first interlayer insulation film and the second interlayer insulation film is a low dielectric film having a bond of Si and a group made of organic constituents, and a plasma treatment is performed before the barrier metal is deposited, using one of a gas capable of replacing at least part of the group made of organic constituents on an exposed surface of the low dielectric film with hydrogen, and a gas capable of decomposing at least part of the group made of organic constituents to form a dangling bond.

Also, according to a manufacturing method of a semiconductor device of the invention, in a manufacturing method of a semiconductor device including the steps of: depositing at least a first interlayer insulation film, a second interlayer insulation film, and a hard mask material on a substrate in which a wiring pattern has been formed; forming a hard mask through etching of the hard mask material using a first resist pattern formed on the hard mask material; forming a via hole penetrating through the first interlayer insulation film and the second interlayer insulation film using a second resist pattern formed on the hard mask; removing the second resist pattern and then forming a trench pattern through etching of the second interlayer insulation film using the hard mask; depositing a barrier metal on the second interlayer insulation film and on inner walls of the via hole and the trench pattern; depositing a wiring material and then embedding the wiring material in interiors of the via hole and the trench pattern; removing extra portion of said wiring material and said barrier metal through CMP and surface is planarized, at least one of the first interlayer insulation film, the second interlayer insulation film, and the hard mask is a low dielectric film having a bond of Si and a group made of organic constituents, and a plasma treatment is performed before the barrier metal is deposited, using one of a gas capable of replacing at least part of the group made of organic constituents on an exposed surface of the low dielectric film with hydrogen, and a gas capable of decomposing at least part of the group made of organic constituents to form a dangling bond.

The invention can be arranged in such a manner that the plasma treatment and the deposition of the barrier metal are performed under one of in situ and in vacuo conditions, or that the method further includes a step of performing sputtering using an Ar gas prior to the plasma treatment, and the Ar sputtering, the plasma treatment, and the depositing of the barrier metal are performed under one of in situ and in vacuo conditions.

In the invention, it is preferable that the low dielectric film is one of methyl silsesquioxane (MSQ), methylated hydrogen silsesquioxane (MHSQ), silicon carbide (SiC), silicon oxycarbide or carbon-doped glass (SiOC or SiCOH), organo sillicated grass (OSG), silicon carbonitride (SiCN), and a porous film of each.

The invention is preferably arranged in such a manner that a mixed gas of hydrogen and a noble gas is used as a gas for the plasma treatment, or that a noble gas is used as a gas for the plasma treatment and RF bias is applied during the plasma treatment.

In the invention, it is preferable that the noble gas includes one of He, Ne, Ar, Kr, Xe, and Rn.

The invention is preferably arranged in such a manner that, in a case where He is used as the gas for the plasma treatment, power of the RF bias is set to a range from 250 W to 400 W both inclusive.

As has been described, according to the invention, in a damascene process using an insulation layer including a low dielectric film having a bond of Si and a group made of organic constituents, such as MSQ, provision of such a structure that can ensure adhesion between the low dielectric film and the barrier metal makes it possible to eliminate a problem that the barrier metal is separated during CMP and scratches are left on the low dielectric film, and to prevent film separation at the barrier metal/low dielectric film interface caused by stress resulted from the multi-level interconnection. The reliability of the damascene process using the low dielectric film can be thus improved.

Also, according to the invention, the plasma treatment is performed using a mixed gas of $H_2$ and He, a He gas, etc. as a pre-step of depositing the barrier metal after the trench pattern or the via hole is formed in the insulation layer including a low dielectric film-having a bond of Si and a group made of organic constituents, such as MSQ. Thus, it is possible to replace the organic constituents (a methyl group in the case of MSQ) on the surface of the low dielectric film with hydrogen or decompose the organic constituents to form a dangling bond. Adhesion of the low dielectric film to the barrier metal can be thus improved. Consequently, it is possible to eliminate a problem that the barrier metal is separated during CMP and scratches are left on the low dielectric film, and to prevent film separation at the barrier metal/low dielectric film interface caused by stress resulted from the multi-level interconnection. The reliability of the damascene process using the low dielectric film can be thus improved.

BRIEF DESCRIPTION OF THE DRAWINGS

FIG. 7A through FIG. 7C are cross sections showing the step-by-step sequence of a via first process according to a first example of the invention;

FIG. 14A through FIG. 14C are cross sections showing the step-by-step sequence of a single damascene process according to a third example of the invention;

DETAILED DESCRIPTION OF THE PREFERRED EMBODIMENT

Figure 1A:
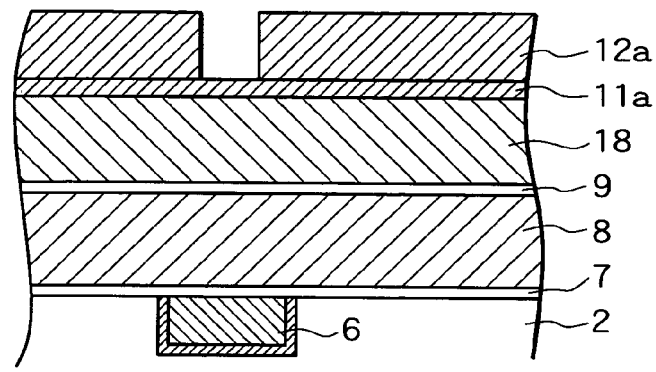
FIG. 1A through FIG. 1C are cross sections showing the step-by-step sequence of a conventional via first process.
Figure 1B:
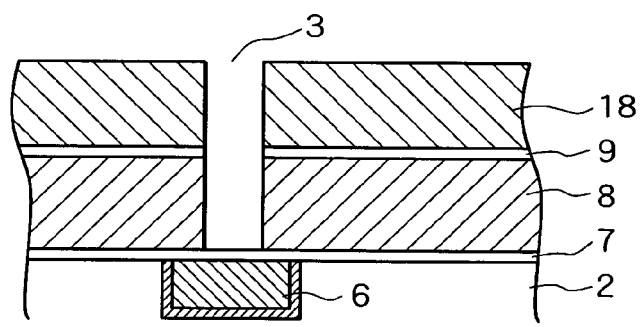

As has been described in the related art column, sputtering using an Ar gas has been used extensively as means for cleaning the surface layer when a semiconductor device is manufactured. Impurities and foreign matters adhering on the surface of a sputtered material can be removed through Ar sputtering; however, applying Ar sputtering to a low dielectric film having a bond of Si and a group made of organic constituents, such as MSQ, cannot improve adhesion of the low dielectric film to a barrier metal.

The reason why is assumed as follows: Ar used for the sputtering has a large size and large energy because of RF bias, and therefore, not only methyl groups covering the MSQ surface, but also MSQ molecules as a whole are sputtered, which allows new MSQ molecules to appear on the sputtered surface, and methyl groups thus cover the surface again. Hence, in order to remove only methyl groups effectively from MSQ, it may be appropriate to use a gas having a small atomic weight and the ability to perform a replacement reaction with methyl groups. Hence, the following experiment was conducted using, as a representative kind of gas, a mixed gas of a highly reactive gas and a noble gas or a single noble gas (to be more specific, a mixed gas of $H_2$ and He or a He gas).

Initially, samples were manufactured by depositing tantalum (Ta), a tantalum nitride (TaN) layer, and a Cu layer as a barrier metal on an MSQ film through sputtering. The film structure was Cu 100 nm/Ta 15 nm/TaN 15 nm/MSQ 300 nm. More specifically, after the MSQ film was subjected to cleaning process described below in a pre-cleaning chamber, Ta and a TaN layer were deposited in a PVD chamber for a barrier metal, and then a Cu layer was deposited in a PVD chamber for Cu. The wafer was transported from chamber to chamber in vacuo (a range of $10^{-7}$ torr or less) to prevent contamination on the MSQ surface.

As the cleaning process, three types as follows were performed: a process of performing only etching using an Ar gas; a process of performing etching using an Ar gas followed by an in situ plasma treatment using a He/$H_2$ mixed gas; and a process of performing etching using an Ar gas followed by an in situ plasma treatment using a He gas. The samples cleaned in the respective processes were subjected to a tape test using an adhesive tape. The result is set forth in Table 1 below.

TABLE 1

| Cleaning Process | Separation Percentage in Tape Test |
| --- | --- |
| Only Ar Etching | 100% |
| Ar Etching + He Plasma Treatment | 100% |
| Ar Etching + He/$H_2$ Plasma Treatment | 0% |

Table 1 reveals that adhesion at the barrier metal/MSQ interface was unsatisfactory in the process performing Ar etching alone and the process performing the He plasma treatment after Ar etching, and the barrier metal layer and the Cu layer were separated from MSQ film at the barrier metal/MSQ interface in all the samples; however, adhesion at the barrier metal/MSQ interface was improved in the process of performing the He/$H_2$ plasma treatment after Ar etching, and no separation occurred. It is understood from the result that the plasma treatment using a gas containing $H_2$ is effective in improving adhesion of MSQ.

Different from $H_2$, He is less reactive but has a smaller atomic weight than Ar, and therefore, may be able to remove only methyl groups from MSQ depending on the conditions. Hence, samples were manufactured by performing cleaning with He plasma having larger energy by gradually applying RF bias during the He plasma treatment, and subjected to a tape test in the same manner as above. The result is set forth in Table 2 below.

TABLE 2

| Cleaning Process | Separation Percentage in Tape Test |
| --- | --- |
| Only Ar Etching | 100% |
| Ar Etching + He Plasma Treatment (Bias 0 W) | 100% |
| Ar Etching + He Plasma Treatment (Bias 250 W) | 0% |
| Ar Etching + He Plasma Treatment (Bias 400 W) | 0% |

Table 2 reveals that no adhesion improving effect was acknowledged in the treatment where no RF bias was applied, whereas when RF bias of 250 W or above was applied, no separation occurred, indicating that adhesion was improved. The reason why is assumed that energy of He plasma without application of RF bias is too small to decompose methyl groups. Hence, the result indicates that even when a gas having no or poor reactivity is used, it is still possible to decompose methyl groups by applying RF bias and conferring energy needed. However, adhesion was not improved by applying RF bias in the case of Ar, from which it is understood that the effect cannot be achieved unless an adequate gas is selected.

It is understood from the results set forth in Table 1 and Table 2 above that adhesion at the interface of MSQ and the barrier metal can be improved through the use of a mixed gas (He/$H_2$) containing a highly reactive gas or a noble gas (He). However, it remains uncertain whether the improvement effect is attributed to removal of methyl groups on the MSQ surface. In general, methyl groups are hydrophobic, whereas hydrogen groups and dangling bonds are hydrophilic. Hence, it is anticipated that removing methyl groups effectively can increase an affinity for water of the MSQ surface, which improves the wetting property and thereby reduces an angle of contact. Hence, samples were manufactured by performing cleaning in the same processes set forth in Table 1 above, and an angle of contact between water and the MSQ surface was measured. The results were set forth in Table 3 and Table 4 below.

TABLE 3

| Cleaning Process | Angle of Contact (deg.) |
| --- | --- |
| Only Ar Etching | 51 |
| Ar Etching + He Plasma Treatment | 45 |
| Ar Etching + He/$H_2$ Plasma Treatment | 32 |

TABLE 4

| Cleaning Process | Angle of Contact (deg.) |
| --- | --- |
| Only Ar Etching | 51 |
| Ar Etching + He Plasma Treatment (Bias 0 W) | 45 |

TABLE 4-continued

| Cleaning Process | Angle of Contact (deg.) |
|---|---|
| Ar Etching + He Plasma Treatment (Bias 250 W) | 18 |
| Ar Etching + He Plasma Treatment (Bias 400 W) | 14 |

Table 3 above reveals that, although a difference between these processes was not clear in the tape test, the angle of contact was reduced slightly in the process of performing the He plasma treatment (no RF bias) after Ar etching in comparison with the process of performing Ar etching alone, from which it is understood that the He plasma treatment itself is effective in improving adhesion. Also, the angle of contact was further reduced in the process of performing the He/$H_2$ plasma treatment after Ar etching, from which it is understood that a $H_2$ gas is highly effective in reforming the surface. In addition, Table 4 above reveals that the angle of contact was gradually reduced with application of RF bias even in the He plasma treatment, and in particular, when RF bias of 250 W or above was applied, the surface reforming effect was higher than that attained in the He/$H_2$ plasma treatment.

Figure 4A:
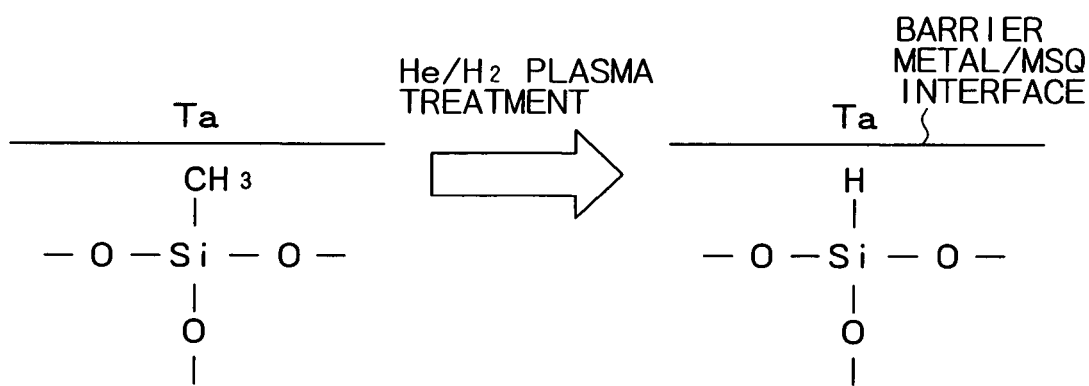
FIG. 4A and FIG. 4B are views schematically showing the mechanism of a plasma treatment of the invention.
Figure 4B:
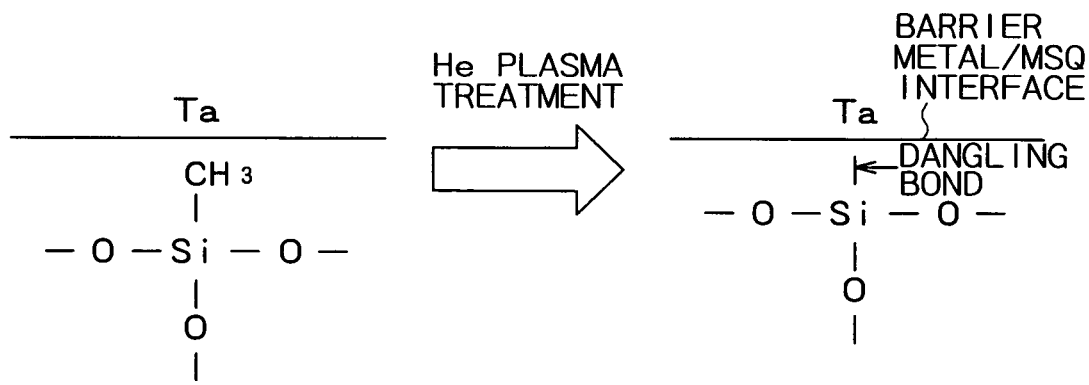

The effect achieved by the plasma treatment will now be explained with reference to FIG. 4A and FIG. 4B. The non-treated MSQ surface is covered with methyl groups, and for example, by exposing the MSQ surface to $H_2$ plasma, a Si—$CH_3$ bond on the MSQ surface is replaced by a Si—H bond as shown in FIG. 4A. It is hence assumed that because a methyl group having a large molecular structure is replaced by hydrogen, a distance between Si and a metal forming the barrier metal becomes shorter, and the bonding strength is thus improved. Also, in the case of the He plasma treatment, as shown in FIG. 4B, it is assumed that a Si—$CH_3$ bond on the MSQ surface is broken to form a dangling bond as RF bias is increased, and the bonding strength between Si and the barrier metal is thus improved.

It is understood from the results of the experiments above that, in order to achieve the adhesion improving effect of the invention, it is sufficient to use a mixed gas containing a highly reactive gas capable of replacing a methyl group with a group having a small molecular structure, such as hydrogen, or a gas capable of decomposing only a methyl group covering the surface without decomposing a MSQ molecule as a whole. Besides He and He/$H_2$, a mixed gas of $H_2$ and a noble gas, such as Ne, Ar, Kr, Xe, and Rn, a gas containing ammonia, etc. can be used.

RF bias may be applied in the He/$H_2$ plasma treatment. In this case, however, hydrogen atoms penetrate into the interior of a substance exposed to plasma, and in particular, in a case where Cu used as a wiring material is exposed, there occurs a problem that Cu becomes brittle. Hence, RF bias needs to be optimized when a hydrogen gas is used.

In regard to a component ratio of a $H_2$ gas and a noble gas, when a ratio of a $H_2$ gas is increased, the reactivity becomes too high to remain controllable, and there is the possibility that a replacement reaction of methyl groups takes place not only on the surface layer, but also in the interior, which undesirably increases a dielectric constant of MSQ. In order to avoid such an inconvenience, it is preferable to set a component ratio such that a few percent of a highly reactive gas, such as $H_2$, is contained (in the case of $H_2$ and He, $H_2$ is 1 to 10% and He is 99 to 90%, for example, $H_2$ and He=4% and 96%). An ammonia gas may be a possible choice when the ability to react with a methyl group is considered. In this case, however, Cu used as a wiring material undergoes nitridation with ammonia, and an adverse effect on the reliability of interconnections is concerned. For this reason, the concentration of ammonia, RF bias, a processing time, etc. need to be optimized.

Also, a material capable of improving adhesion through the plasma treatment using the above-specified gases can be any material containing organic constituents or any material containing a group having a large molecular structure. Besides MSQ, the material can be methylated hydrogen silsesquioxane (MHSQ), silicon carbide (SiC), silicon carbonitride (SiCN), silicon oxycarbide or carbon-doped glass (SiOC or SiCOH), organo sillicated grass (OSG), etc., or a porous film of each. Also, these films can be formed through any method, and an arbitrary method, such as the CVD method and the coating method, can be used.

Figure 5A:
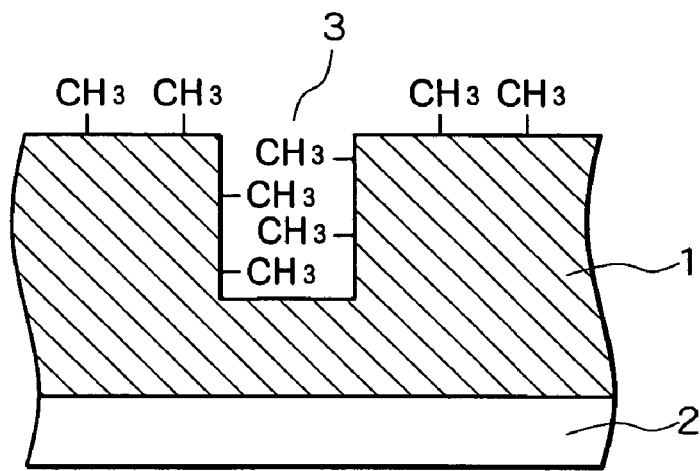
FIG. 5A through FIG. 5C are cross sections showing a part of the fabrication sequence including the plasma treatment of the invention.
Figure 5B:
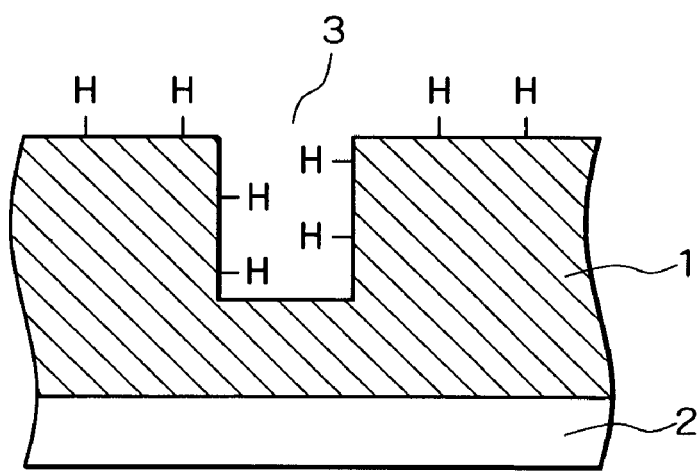
Figure 5C:
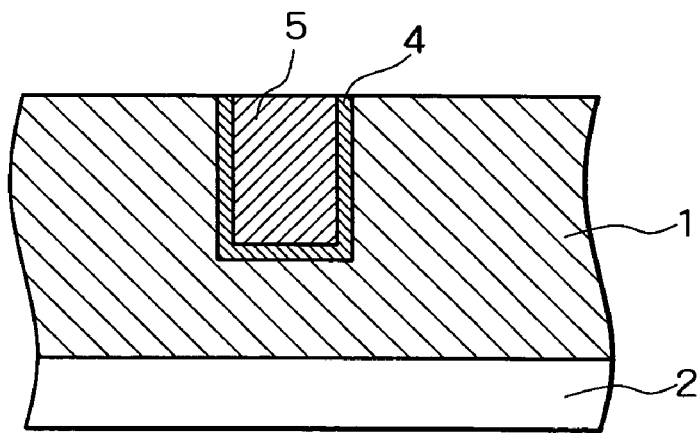

FIG. 5A through FIG. 5C are schematic views showing the sequence in a case where the plasma treatment described above, which is capable of replacing a Si—$CH_3$ bond on the MSQ surface with a Si—H bond, is applied to a damascene process. When a via hole 3 is formed in an insulation layer including MSQ 1 deposited on a substrate 2, the MSQ exposed surface on the main surface and on the inner wall of the via hole 3 is covered with methyl groups as shown in FIG. 5A. By applying the plasma treatment using a He/$H_2$ mixed gas under these conditions, methyl groups are replaced by hydrogen as shown in FIG. 5B, and the surface thereby turns to hydrophilic, which improves adhesion to an inorganic material. By depositing a barrier metal 4 as shown in FIG. 5C under these conditions, MSQ 1 bonds to the barrier metal 4 so firmly that even when a wiring metal is embedded in the via hole 3 through CMP, the barrier metal 4 will be separated from neither the MSQ surface nor the inner wall of the via hole 3. It is thus possible to improve the reliability of the multi-level interconnection.

Although the plasma treatment using a He/$H_2$ mixed gas or a He gas has been known, it should be noted that the effect of improving adhesion to the barrier metal by replacing a methyl group of a low dielectric film, such as MSQ, with hydrogen or by decomposing a methyl group to form a dangling bond through the plasma treatment is a novel fact obtained by the knowledge of the inventor of the present application.

Figure 6A:
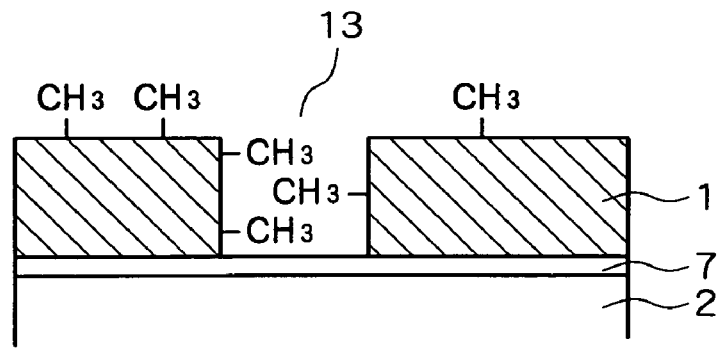
FIG. 6A through FIG. 6C are cross sections showing a part of the fabrication sequence including a structure and the plasma treatment of the invention.
Figure 6B:
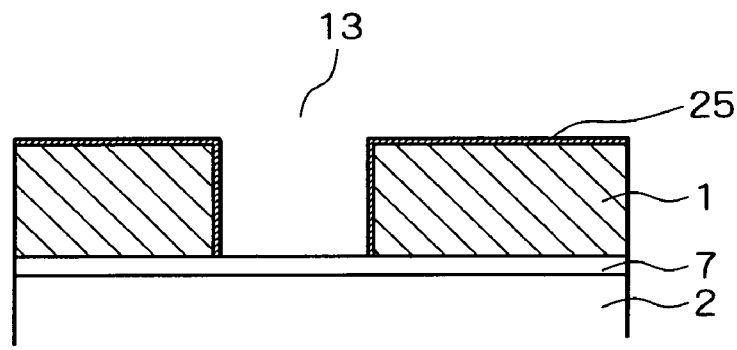
Figure 6C:
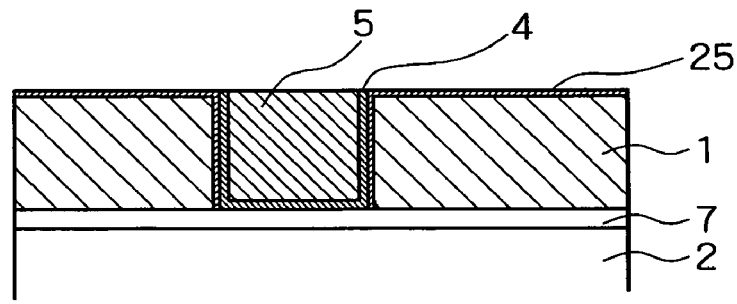

FIG. 6A through FIG. 6C are schematic views showing the sequence in a case where the plasma treatment described above, which is capable of breaking a Si—$CH_3$ bond on the MSQ surface to form a dangling bond, is applied to a damascene process. When a wiring trench pattern 13 is formed in an insulation layer including MSQ 1 deposited on a substrate 2, the MSQ exposed surface on the main surface and the inner wall of the wiring trench pattern 13 is covered with methyl groups as shown in FIG. 6A. By applying the plasma treatment using a He gas with application of RF bias, Si—$CH_3$ bonds are broken to form a dangling bond layer 25 as shown in FIG. 6B.

A releasing degree of C from the dangling bond layer 25 and a thickness thereof can be changed depending on the plasma treatment conditions. Hence, as shown in FIG. 6C, samples were prepared by depositing a barrier metal 4 and Cu used as a wiring material 5 on the wiring trench pattern 13, and analysis was conducted as to scratches caused by separation resulted from CMP, by varying a releasing degree of C and the thickness. The number of scratch defects and an interconnect capacitance with respect to the concentration of C of the dangling bond layer 25 and the film thickness thereof were measured through the local EDX method, the result of which is set forth in Table 5 below.

TABLE 5

| C Concentration (atom %) | Film Thickness (nm) | Number of Scratches (counts) | Interconnect capacitance (pF/mm) |
|---|---|---|---|
| 15 | 0 | 1213 | 0.081 |
| 12 | 5 | 501 | 0.081 |
| 10 | 10 | 52 | 0.082 |
| 7 | 14 | 12 | 0.083 |
| 2 | 25 | 15 | 0.086 |
| 1 | 41 | 11 | 0.115 |

It is confirmed from Table 5 above that the number of scratch defects due to adhesion was reduced noticeably as the concentration of C of the dangling bond layer 25 was lowered. In particular, when the concentration of C was 7 atom % or below, a satisfactory result was obtained. It should be noted, however, that when the film thickness of the dangling bond layer 25 was 41 nm, an increase in interconnect capacitance was confirmed. Hence, it is preferable that the concentration of C of the dangling bond layer 25 is 2 atom % or above and the film thickness thereof is 25 nm or less.

Samples were prepared by forming a Ta single-layer, a TaN single-layer, a Ta/TaN lamination layer as the barrier metal 4 in the wiring groove on which the dangling bond layer 25 had been formed, and evaluation was conducted in the same manner as above. The resulting numbers of scratch defects with respect to the respective barrier metals are set forth in Table 6 below.

TABLE 6

| Barrier Metal | C Concentration (atom %) | Film Thickness (nm) | Number of Scratches (counts) |
|---|---|---|---|
| Ta Single-layer | 7 | 14 | 18 |
| TaN Single-layer | 7 | 14 | 13 |
| Ta/TaN Lamination Layer | 7 | 14 | 12 |
| Ta Single-layer | 10 | 10 | 249 |
| TaN Single-layer | 10 | 10 | 54 |
| Ta/TaN Lamination Layer | 10 | 10 | 52 |

Table 6 above reveals that when the concentration of C of the dangling bond layer 25 was 7 atom %, the number of scratch defects was satisfactorily small in all the barrier metal structures; by contrast, when the concentration of C of the dangling bond layer 25 was 10 atom %, the number of scratch defects was increased in the case of the Ta single-layer alone. It is thus understood that a barrier metal material that comes in contact with the dangling bond layer 25 is preferably TaN. Because Ta excels TaN in the wetting property and adhesion to Cu, the barrier metal preferably has a lamination structure of Ta/TaN.

Although the barrier metal having the Ta/TaN lamination structure has been known, it should be noted that the fact that the Ta/TaN lamination structure is optimal when forming a barrier metal on the wiring groove or on the via hole on which the dangling bond layer has been formed in the damascene process using a low dielectric film having a bond of Si and a group made of organic constituents is a novel fact obtained by the knowledge of the inventor of the present application.

In order to describe the embodiment of the invention discussed above more in detail, the following description will describe, with reference to the accompanying drawings, concrete examples of a damascene process to which the structure and the plasma treatment of the invention are applied.

FIRST EXAMPLE

Firstly, a dual damascene process according to a first example of the invention will be explained with reference to FIG. 7A through FIG. 9C. FIG. 7A through FIG. 9C are cross sections showing the step-by-step sequence of a via first process to which the structure and the plasma treatment of the invention are applied.

Initially, as shown in FIG. 7A, after a lower layer wiring 6 made of Cu, Cu alloy or the like is formed in a substrate 2 through a known method, a first etching stopper film 7, a first interlayer insulation film 8, a second etching stopper film 9, and a second interlayer insulation film 10 are formed sequentially from bottom to top in certain thickness through the CVD method, the plasma CVD method, etc. A film that can achieve the effect of the plasma treatment of the invention can be any low dielectric film containing hydrophobic groups having a large molecular structure like MSQ that contains methyl groups, and it may be MHSQ, SiC, SiCN, SiOC, SiCOH, etc. or a porous film of each. The low dielectric film can be formed through any adequate means, such as CVD and coating.

The following description will describe a case where MSQ is used as the second interlayer insulation film 10. It should be appreciated, however, that the low dielectric film can be used as the first interlayer insulation film 8 or as both the first and second interlayer insulation films 8 and 10. Also, materials of films other than the low dielectric film are not especially limited. Any combination of materials such that can attain an etching selection ratio can be used, and materials can be selected from $SiO_2$, SiN, SiON, etc. as needed. In a case where a material other than $SiO_2$ is used as the second interlayer insulation film 10, a problem may possibly occur in the CMP step of the wiring. In order to avoid such a problem, a cap insulation film may be formed on the second interlayer insulation film 10.

Subsequently, after a first reflection preventing film 11a to be used to control reflection of exposing light is deposited on the second interlayer insulation film 10 in a thickness of approximately 50 nm, chemically amplified resist to be used to form a via hole pattern is applied thereon in a thickness of approximately 600 nm, which is subjected to exposure and development through KrF photolithography. A first resist pattern 12a is thereby formed.

Then, as shown in FIG. 7B, the first reflection preventing film 11a, the second interlayer insulation film 10, the second etching stopper film 9, and the first interlayer insulation film 8 are etched away sequentially through known dry etching, and a via hole 3 penetrating through these films is thereby formed. Subsequently, the first resist pattern 12a and the first reflection preventing film 11a are stripped away through oxygen plasma ashing and a wet treatment using an organic separating liquid, and a residue from the dry etching is removed.

Then, as shown in FIG. 7C, after a second reflection preventing film 11b is deposited in a thickness of approximately 50 nm, a chemically amplified resist is applied thereon in a thickness of approximately 600 nm and baked followed by exposure and development through KrF photolithography. A second resist pattern 12b to be used to form a wiring trench pattern is thereby formed. The exposed second reflection preventing film 11b is then removed through a dry etching method.

Then, the second interlayer insulation film 10 is etched away using the second etching stopper film 9 as an etching stopper, and a wiring trench pattern 13 is thereby formed. Subsequently, the second resist pattern 12b and the second reflection preventing film 11b are stripped away through oxygen plasma ashing and a wet treatment using an organic separating liquid, and a residue from the dry etching is removed (see FIG. 8A).

Figure 8A:
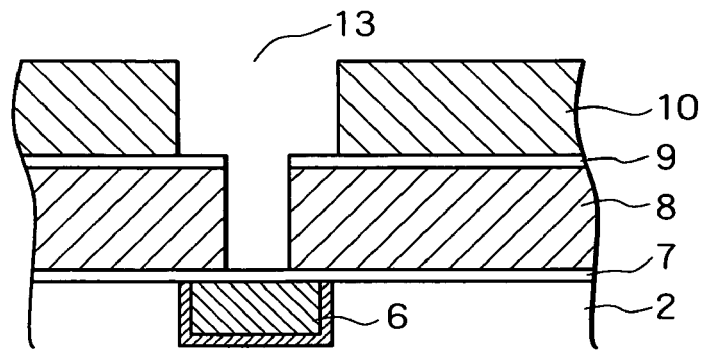
FIG. 8A through FIG. 8C are cross sections showing the step-by-step sequence of the via first process according to the first example of the invention.
Figure 8B:
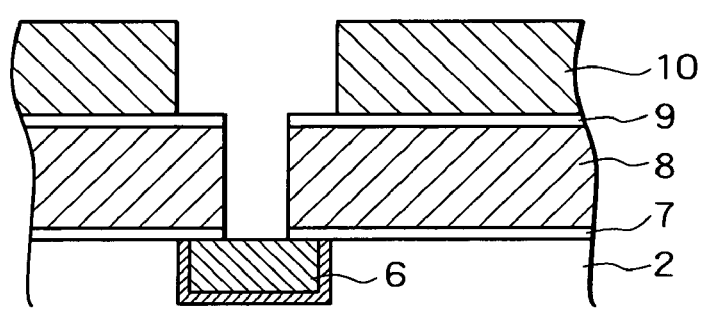

Then, as shown in FIG. 8B, after the exposed first etching stopper film 7 is removed through a dry etching method, the surface of the lower layer wiring 6 at the bottom of the via hole 3 is cleaned through sputtering using an Ar gas.

Figure 8C:
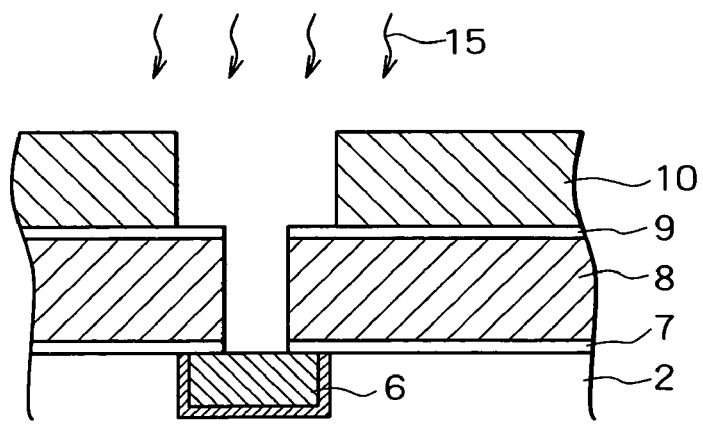

Under these conditions, the surface of the second interlayer insulation film (MSQ) 10 and the sidewalls of the wiring trench pattern 13 and the via hole 3 are covered with methyl groups, and satisfactory adhesion cannot be attained by forming a barrier metal directly thereon. Hence, as shown in FIG. 8C, the plasma treatment, which is the characteristic of the invention, is performed in situ, that is, within the same chamber and device used for Ar sputtering or in vacuo, that is, while maintaining a vacuum. This plasma treatment is preferably a plasma treatment using a He/$H_2$ mixed gas or a plasma treatment using a He gas with application of certain RF bias. For example, when the plasma treatment using a He/$H_2$ mixed gas is performed, methyl groups of MSQ exposed on the main surface and the trench sidewall are replaced by hydrogen, and adhesion to the barrier metal is thereby improved.

It is preferable to perform the Ar sputtering, the He/$H_2$ plasma treatment, and the He plasma treatment under the conditions set forth below.

Figure 9A:
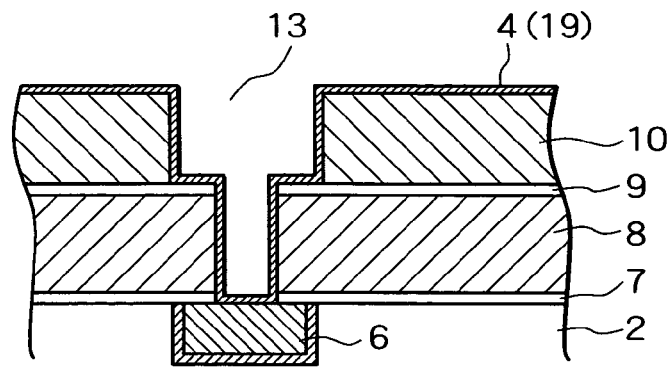
FIG. 9A through FIG. 9C are cross sections showing the step-by-step sequence of the via first process according to the first example of the invention.

<Conditions for Ar Sputtering Treatment>
Gas pressure: approximately 0.2 to 5 mTorr
Gas kind: 100% of argon
RF power source: approximately 200 W to 600 W
RF bias source: approximately 200 W to 400 W
Time: approximately 60 seconds <Conditions for He/$H_2$ Plasma Treatment>
Gas pressure: approximately 20 to 100 mTorr
Gas kind: mixed gas of hydrogen and helium, preferably with a mixing percentage of $H_2$ and He=4% and 96%
RF power source: approximately 200 W to 600 W
Time: approximately 60 seconds <Conditions for He Plasma Treatment>
Gas pressure: approximately 20 to 100 mTorr
Gas kind: 100% of helium
RF power source: approximately 200 W to 600 W
RF bias source: approximately 200 W to 400 W
Time: approximately 60 seconds After the MSQ surface is reformed through the plasma treatment, as shown in FIG. 9A, a barrier metal 4, such as tantalum (Ta) and tantalum nitride (TaN), to be used to prevent diffusion of a wiring material and thereby to improve adhesion is formed, for example, in a thickness of approximately 30 nm in situ, that is, within the same chamber and device or in vacuo, that is, while maintaining a vacuum. Subsequently, a seed metal 19 of Cu to be used as the wiring material is formed in a film thickness of approximately 100 nm to make it easier for Cu-plating to be grown. In this instance, it is preferable to set the concentration of nitrogen in tantalum nitride (TaN) to a range from 10 atom % to 50 atom %.

Figure 9B:
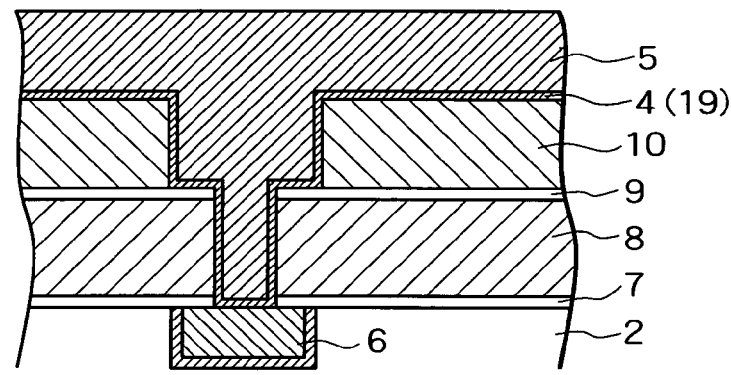
Figure 9C:
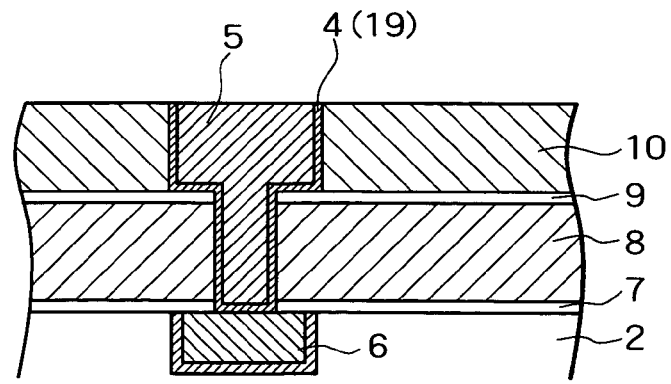

Then, as shown in FIG. 9B, Cu to be used as a wiring material 5 is formed through plating, and the wiring trench pattern 13 and the via hole 3 are filled with Cu, after which, as shown in FIG. 9C, extra Cu and barrier metal are removed by polishing through CMP and the surface is planarized. A dual damascene structure is thus completed.

With the semiconductor device obtained through the above method, neither separation of the barrier metal at the MSQ interface nor starches on the MSQ surface described in the conventional examples are acknowledged, which proves that the plasma treatment of the invention is effective for a process using MSQ.

SECOND EXAMPLE

A dual damascene process according a second example of the invention will now be explained with reference to FIG. 10A through FIG. 13B. FIG. 10A through FIG. 13B are cross sections showing the step-by-step sequence of a dual hard mask process to which the structure and the plasma treatment of the invention are applied.

Figure 10A:
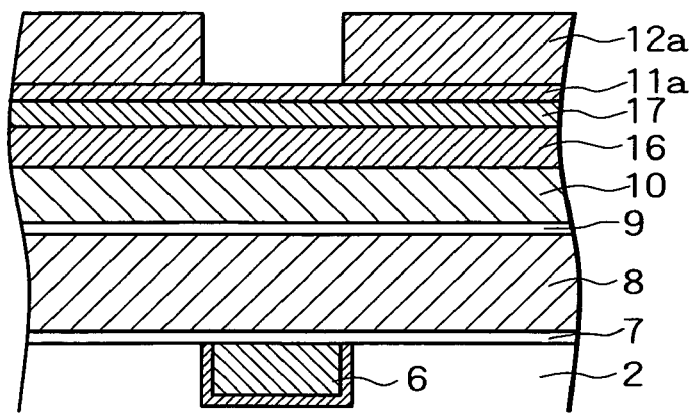
FIG. 10A through FIG. 10C are cross sections showing the step-by-step sequence of a dual hard mask process according to a second example of the invention.

Initially, in the same manner as the first example above, as shown in FIG. 10A, after a lower layer wiring 6 made of Cu, Cu alloy or the like is formed in a substrate 2 through a known method, a first etching stopper film 7, a first interlayer insulation film 8, a second etching stopper film 9, and a second interlayer insulation film 10 are formed sequentially from bottom to top through the CVD method, the plasma CVD method, etc. Then, in this example, a first hard mask film 16 and a second hard mask film 17 to be used as an etching mask for a wiring trench pattern are deposited on these films.

This example will also describe a case where MSQ is used as the second interlayer insulation film 10. It should be appreciated, however, that instead of or in addition to the second interlayer insulation film 10, at least one of the first interlayer insulation film 8, the first hard mask film 16, and the second hard mask film 17 may be a low dielectric film having a bond of Si and a group made of organic constituents, such as MSQ, MHSQ, SiC, SiCN, SiOC, SiCOH and OSG.

Subsequently, after a first reflection preventing film 11a is formed on the second hard mask film 17 in a thickness of approximately 50 nm, chemically amplified resist is applied thereon in a thickness of approximately 600 nm, which is subjected to exposure and development through KrF photolithography. A first resist pattern 12a is thereby formed.

Figure 10B:
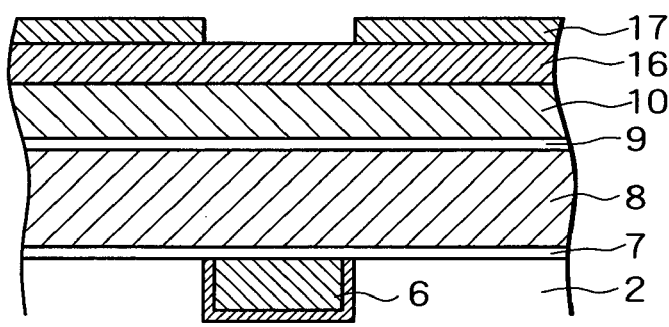

Then, as shown in FIG. 10B, the first reflection preventing film 11a and the second hard mask film 17 are etched away through known dry etching, using the first resist pattern 12a, and an opening to be used to form a wiring trench pattern through etching is thereby formed. Subsequently, the first resist pattern 12a and the first reflection preventing film 11a are stripped away through oxygen plasma ashing and a wet treatment using an organic separating liquid, and a residue from the dry etching is removed.

Figure 10C:
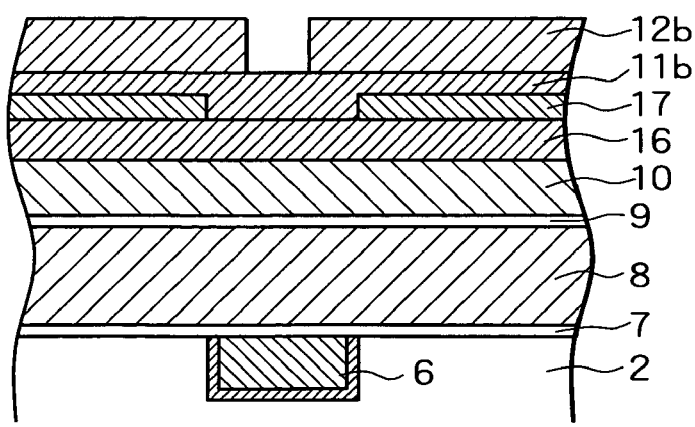

Then, as shown in FIG. 10C, after a second reflection preventing film 11b is formed in a thickness of approximately 50 nm, chemically amplified resist is applied thereon in a thickness of approximately 600 nm and baked followed by exposure and development through KrF photolithography. A second resist pattern 12b having an opening within the etched region of the second hard mask film 17 to be used to form a via hole is thereby formed.

Figure 11A:
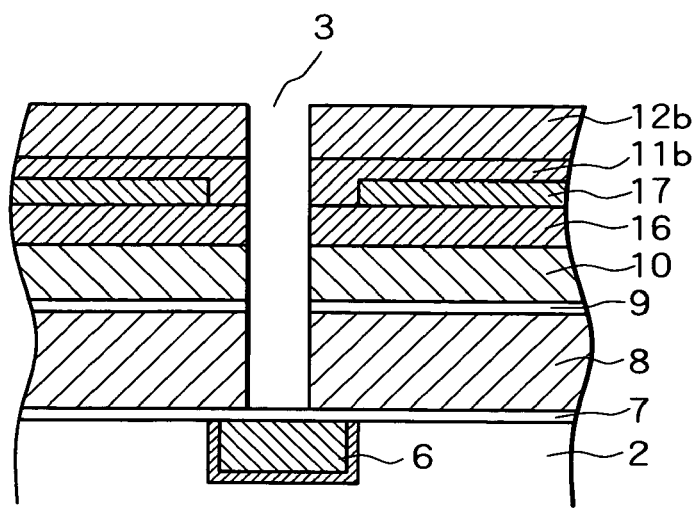
FIG. 11A through FIG. 11C are cross sections showing the step-by-step sequence of the dual hard mask process according to the second example of the invention.

Then, as shown in FIG. 11A, the second reflection preventing film 11b, the first hard mask film 16, the second interlayer insulation film 10, the second etching stopper film 9, and the first interlayer insulation film 8 are etched away through known dry etching, using the second resist pattern 12b as a mask, and a via hole 3 penetrating through these films is thereby formed.

Figure 11B:
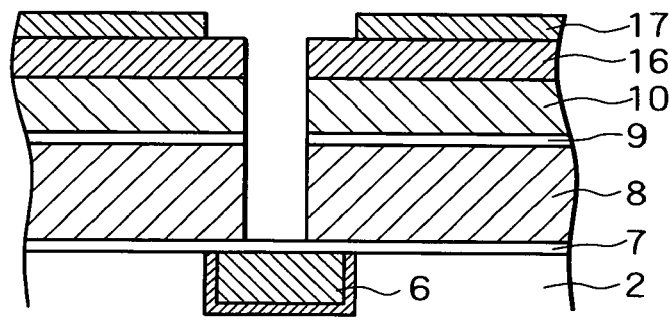
Figure 11C:
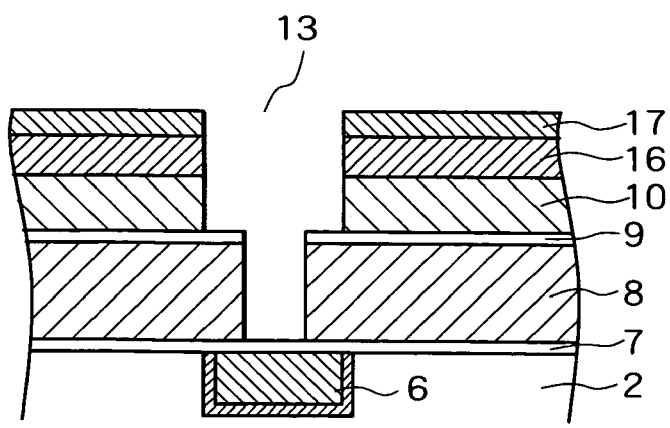

Then, as shown in FIG. 11B, the second resist pattern 12b and the second reflection preventing film 11b are stripped away through oxygen plasma ashing and a wet treatment using an organic separating liquid, and a residue from the dry etching is removed.

Figure 1C:
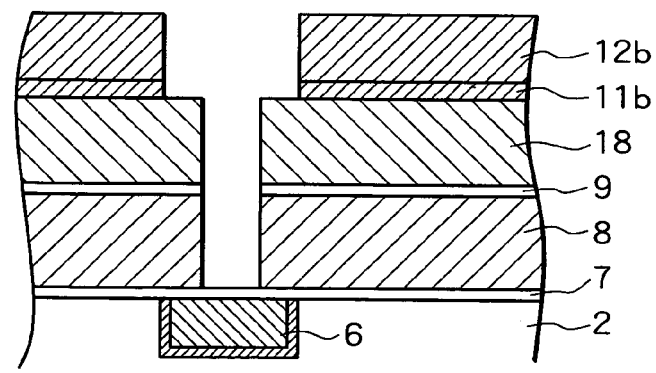
Figure 2A:
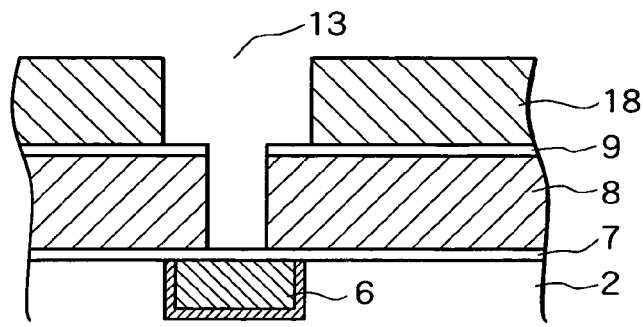
FIG. 2A through FIG. 2C are cross sections showing the step-by-step sequence of the conventional via first process.
Figure 2B:
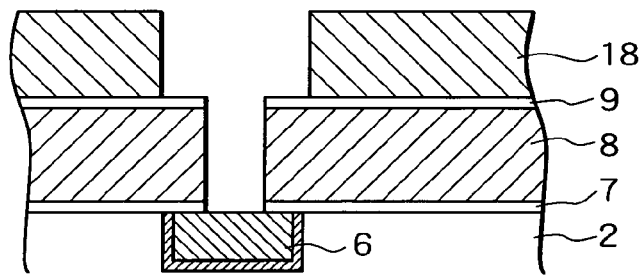
Figure 2C:
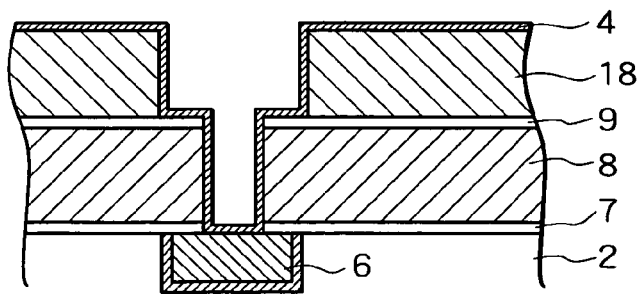
Figure 3A:
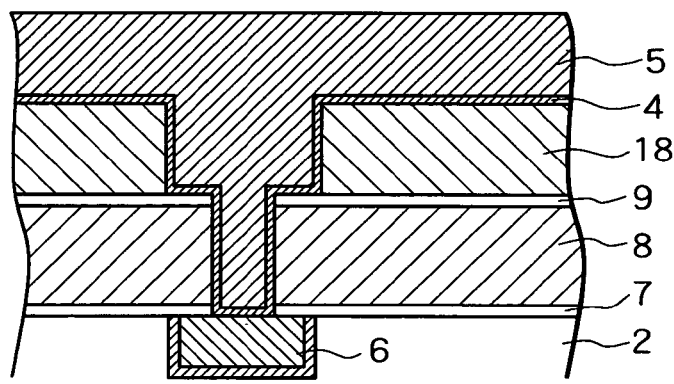
FIG. 3A and FIG. 3B are cross sections showing the step-by-step sequence of the conventional via first process.
Figure 3B:
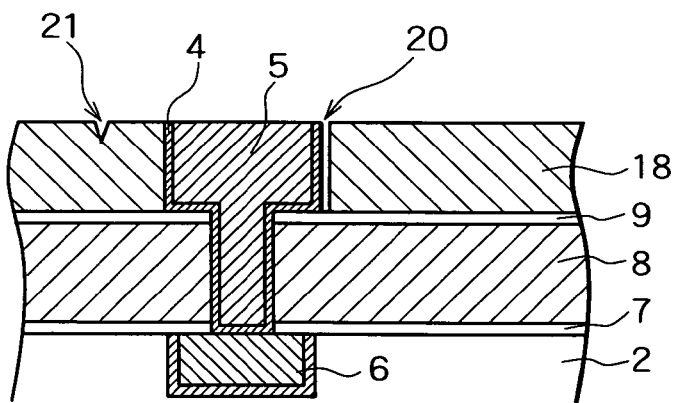

Then, as shown in FIG. 1C, the first hard mask film 16 and the second interlayer insulation film 10 are etched away through a known dry etching method, using the second hard mask film 17 as a mask, and a wiring trench pattern 13 is thereby formed.

Figure 12A:
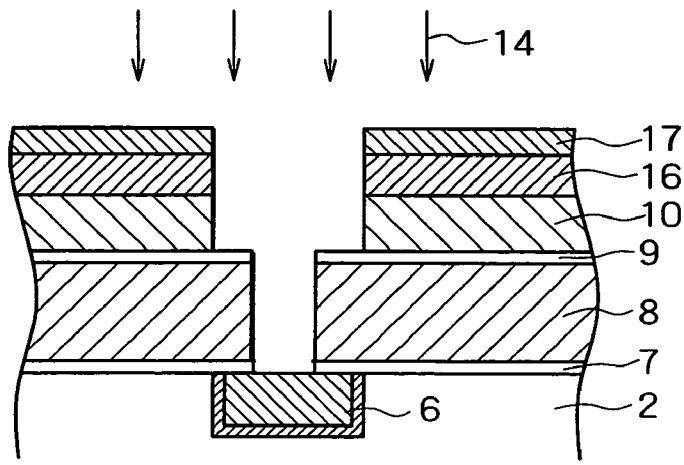
FIG. 12A through FIG. 12C are cross sections showing the step-by-step sequence of the dual hard mask process according to the second example of the invention.
Figure 12B:
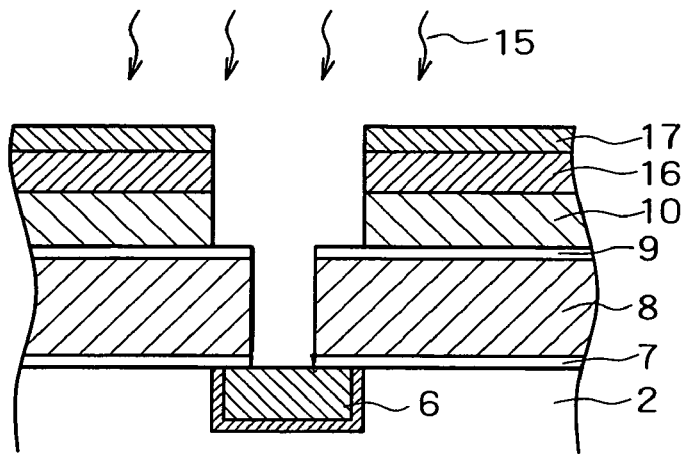

Then, as shown in FIG. 12A, after the exposed first etching stopper film 7 is removed through a dry etching method, the surface of the lower layer wiring 6 at the bottom of the via hole 3 is cleaned through sputtering using an Ar gas. Subsequently, as shown in FIG. 12B, the plasma treatment, which is performed in situ, that is, within the same chamber and device used for Ar sputtering or in vacuo, that is, while maintaining a vacuum. The method, the conditions, the gas kind, etc. of the plasma treatment are the same as those set forth in the first example above.

Figure 12C:
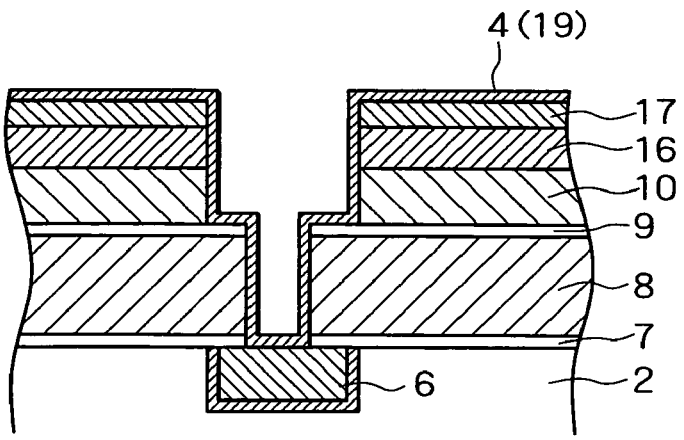

After the MSQ surface is reformed through the plasma treatment, as shown in FIG. 12C, a barrier metal 4, such as tantalum (Ta) and tantalum nitride (TaN), to be used to prevent diffusion of a wiring material and thereby to improve adhesion is formed, for example, in a thickness of approximately 30 nm in situ, that is, within the same chamber and device or in vacuo, that is while maintaining a vacuum. Subsequently, a seed metal 19 of Cu to be used as the wiring material is formed in a film thickness of approximately 100 nm to make it easier for Cu-plating to be grown. In this instance, it is preferable to set the concentration of nitrogen in tantalum nitride (TaN) to a range from 10 atom % to 50 atom %.

Figure 13A:
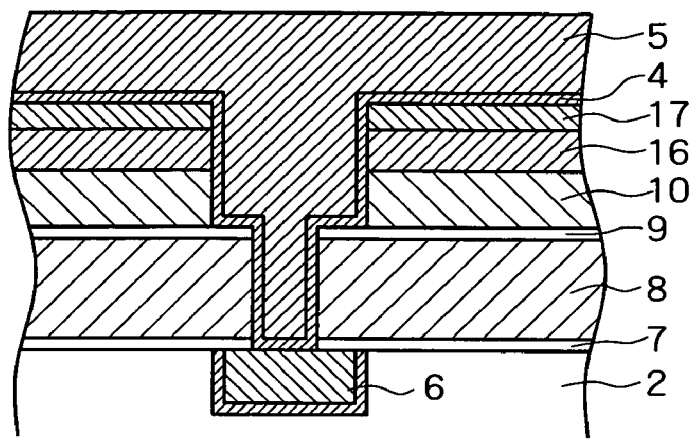
FIG. 13A and FIG. 13B are cross sections showing the step-by-step sequence of the dual hard mask process according to the second example of the invention.
Figure 13B:
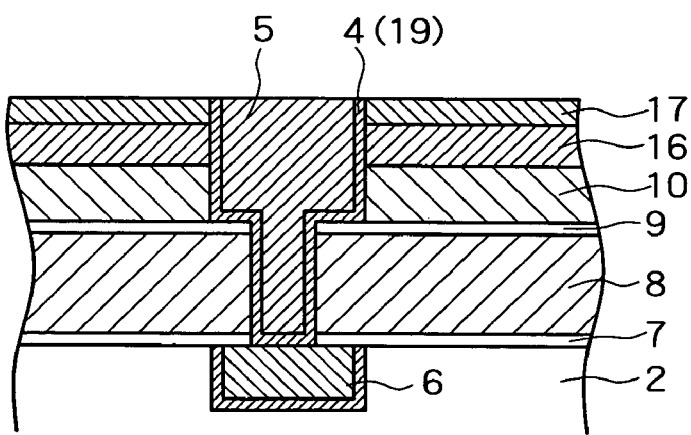

Then, as shown in FIG. 13A, Cu to be used as a wiring material 5 is formed through plating, and the wiring trench pattern 13 and the via hole 3 are filled with Cu, after which, as shown in FIG. 13B, extra Cu and barrier metal are removed by polishing through CMP and the surface is planarized. A dual damascene structure is thus completed.

In a case where organic films are used for all the interlayer insulation films, in the step of FIG. 11A, all of the second reflection preventing film 11b, the first hard mask film 16, the second interlayer insulation film 10, and the second etching stopper film 9 are etched away using the second resist pattern 12b. Then, in the step of FIG. 11C, not only can the wiring trench pattern 13 be formed through etching of the first hard mask film 16 and the second interlayer insulation film 10 using the second hard mask film 17, but also the via hole 3 penetrating through to the first etching stopper film 7 can be formed at the same time through etching of the first interlayer insulation film 8.

With the semiconductor device obtained in this manner, as with the first example above, neither separation of the barrier metal at the MSQ interface nor scratches on the MSQ surface are acknowledged, which proves that the structure and the plasma treatment of the invention are effective for a process using MSQ.

THIRD EXAMPLE

A single damascene process according to a third example of the invention will now be explained with reference to FIG. 14A through FIG. 17C. FIG. 14A through FIG. 17C are cross sections showing the step-by-step sequence of the single damascene process to which the structure and the plasma treatment of the invention are applied.

Initially, as shown in FIG. 14A, a first etching stopper film 7 and a first interlayer insulation film 8 are formed sequentially from bottom to top in certain thickness atop a lower layer wiring 6 through the CVD method, the plasma CVD method, etc. Then, after a first reflection preventing film 11a to be used to control reflection of exposing light is deposited on the first interlayer insulation film 8 in a thickness of approximately 50 nm, chemically amplified resist to be used to form a via hole pattern is applied thereon in a thickness of approximately 500 nm, which is subjected to exposure and development through ArF photolithography. A first resist pattern 12a is thereby formed.

A film that can achieve the effect of the plasma treatment of the invention can be any low dielectric film containing hydrophobic groups having a large molecular structure like MSQ that contains methyl groups, and it may be MHSQ, SiC, SiCN, SiOC, SiCOH, and OSG, etc. or a porous film of each. The low dielectric film can be formed through any adequate means, such as CVD and coating.

The following description will describe a case where MSQ is used as both the first interlayer insulation film 8 and a second interlayer insulation film 10. It should be appreciated, however, that the low dielectric film can be used as either of the first interlayer insulation film 8 and the second interlayer insulation film 10. Also, materials of films other than the low dielectric film are not especially limited. Any combination of materials such that can attain an etching selection ratio can be used, and materials can be selected from $SiO_2$, SiN, SiON, SiC, SiCN, etc. as needed.

Then, as shown in FIG. 14B, the first reflection preventing film 11a and the first interlayer insulation film 8 are etched away sequentially through known dry etching, and a via hole 3 penetrating through these films is thereby formed. Subsequently, the first resist pattern 12a and the first reflection preventing film 11a are stripped away through oxygen plasma ashing and a wet treatment using an organic separating liquid, and a residue from the dry etching is removed.

Then, as shown in FIG. 14C, after the exposed first etching stopper film 7 is removed through a dry etching method, the surface of the lower layer wiring 6 at the bottom of the via hole 3 is cleaned through sputtering using an Ar gas. Subsequently, the plasma treatment, which is the characteristic of the invention, is performed in situ, that is, within the same chamber and device used for Ar sputtering or in vacuo, that is, while maintaining a vacuum. The method, the conditions, the gas kind, etc. of the plasma treatment are the same as those set forth in the first and second examples above.

Figure 15A:
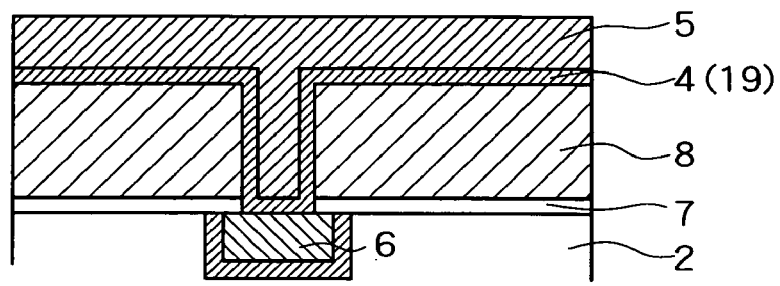
FIG. 15A through FIG. 15C are cross sections showing the step-by-step sequence of the single damascene process according to the third example of the invention.

This example will describe a case where the He plasma treatment is performed. After a dangling bond layer is formed on the MSQ surface through the He plasma treatment, as shown in FIG. 15A, a barrier metal 4, such as tantalum (Ta) and tantalum nitride (TaN), to be used to prevent diffusion of a wiring material and thereby to improve adhesion is formed, for example, in a thickness of approximately 30 nm in situ, that is, within the same chamber and device or in vacuo, that is, while maintaining a vacuum. Subsequently, a seed metal 19 of Cu to be used as the wiring material is formed in a film thickness of approximately 100 nm to make it easier for Cu-plating to be grown. In this instance, it is preferable to set the concentration of nitrogen in tantalum nitride (TaN) to a range from 10 atom % to 50 atom %.

Figure 15B:
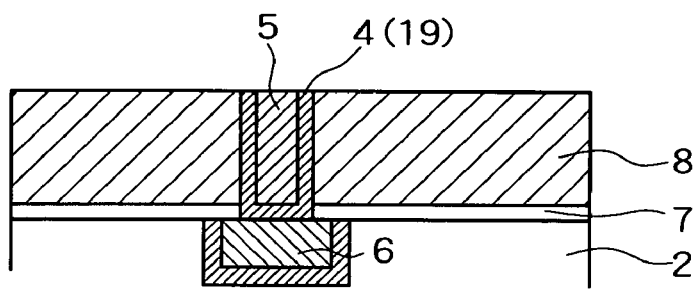
Figure 15C:
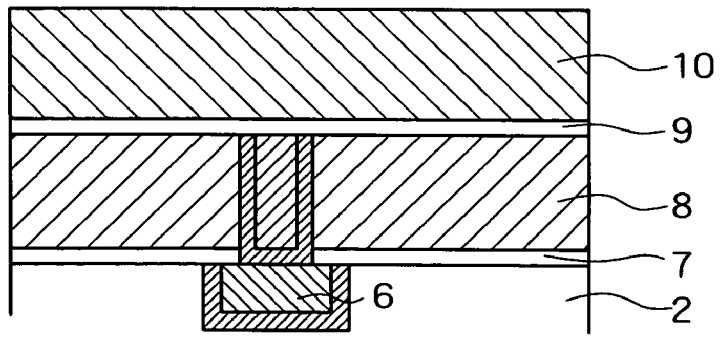

Then, after Cu to be used as a wiring material 5 is formed through plating and the via hole 3 is filled with Cu, as shown in FIG. 15B, extra Cu and barrier metal are removed by polishing through CMP and the surface is planarized. A via plug is thus completed. Subsequently, as shown in FIG. 15C, a second etching stopper film 9 and a second interlayer insulation film 10 are formed sequentially from bottom to top in certain thickness for the use of the wiring.

Figure 16A:
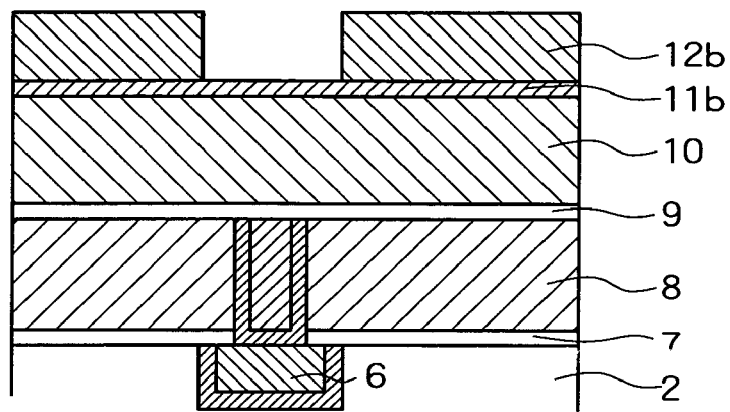
FIG. 16A and FIG. 16B are cross sections showing the step-by-step sequence of the single damascene process according to the third example of the invention.

Then, as shown in FIG. 16A, after a second reflection preventing film 11b to be used to control reflection of exposing light is deposited on the second interlayer insulation film 10 in a thickness of approximately 50 nm, chemically amplified resist to be used to form a via hole pattern is applied thereon in a thickness of approximately 400 nm, which is subjected to exposure and development through ArF photolithography. A second resist pattern 12b is thereby formed.

Figure 16B:
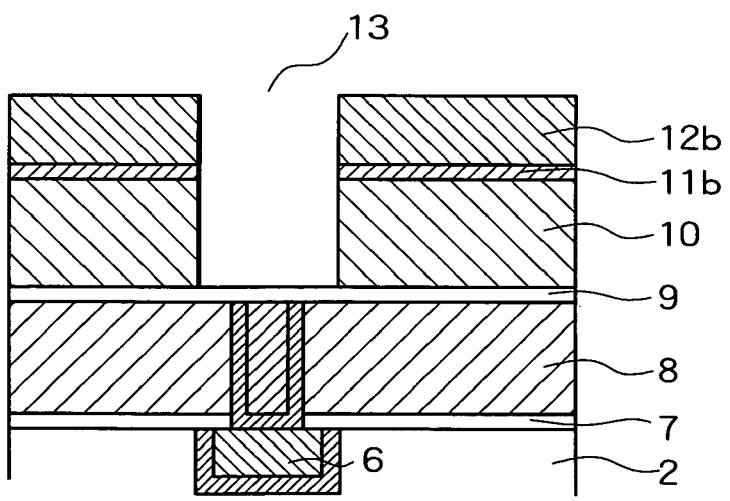

Then, as shown in FIG. 16B, the second reflection preventing film 11b and the second interlayer insulation film 10 are etched away sequentially through known dry etching, and a wiring trench pattern 13 penetrating through these films is thereby formed. Subsequently, the second resist pattern 12b and the second reflection preventing film 11b are stripped away through oxygen plasma ashing and a wet treatment using an organic separating liquid, and a residue from the dry etching is removed.

Figure 17A:
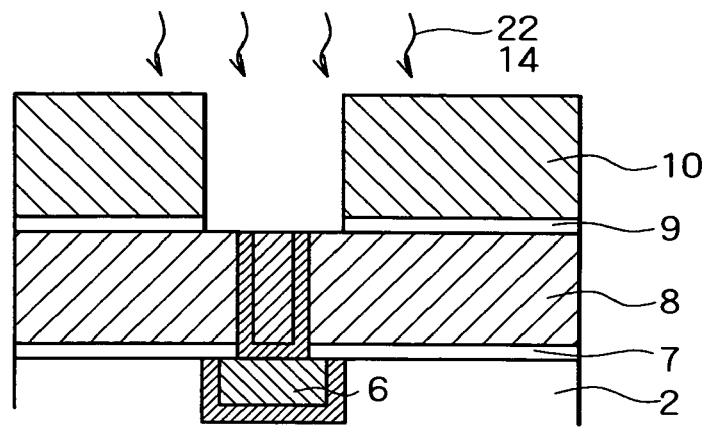
FIG. 17A through FIG. 17C are cross sections showing the step-by-step sequence of the single damascene process according to the third example of the invention.

Then, as shown in FIG. 17A, after the exposed second etching stopper film 9 is removed through a dry etching method, the surface of the via pattern at the bottom of the wiring trench pattern 13 is cleaned through sputtering using an Ar gas. Subsequently, the plasma treatment, which is the characteristic of the invention, is performed in situ, that is, within the same chamber and device used for Ar sputtering or in vacuo, that is, while maintaining a vacuum. The method, the conditions, the gas kind, etc. are the same as those applied when forming the via plug.

Figure 17B:
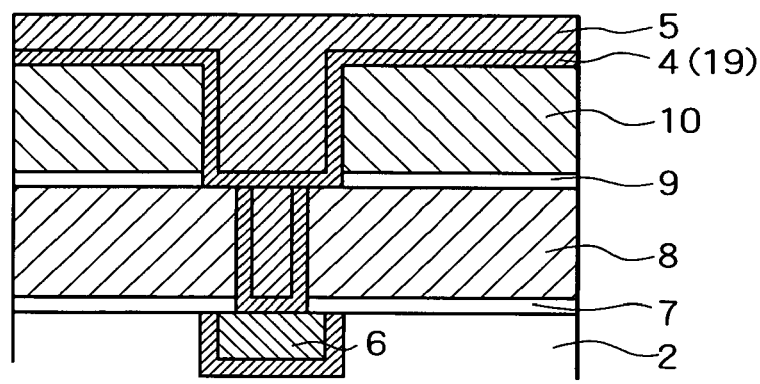

This example will describe a case where the He plasma treatment is performed. After a dangling bond layer is formed on the MSQ surface through the He plasma treatment, as shown in FIG. 17B, a barrier metal 4, such as tantalum (Ta) and tantalum nitride (TaN), to be used to prevent diffusion of a wiring material and thereby to improve adhesion is formed, for example, in a thickness of approximately 30 nm in situ, that is, within the same chamber and device or in vacuo, that is, while maintaining a vacuum. Subsequently, a seed metal 19 of Cu to be used as the wiring material is formed in a film thickness of approximately 100 nm to make it easier for Cu-plating to be grown. In this instance, it is preferable to set the concentration of nitrogen in tantalum nitride (TaN) to a range from 10 atom % to 50 atom %.

Figure 17C:
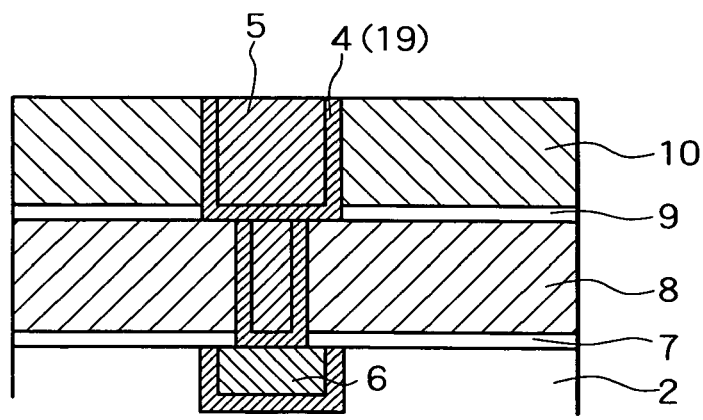

Then, after Cu to be used as a wiring material 5 is formed through plating and the wiring trench pattern 13 is filled with Cu, as shown in FIG. 17C, extra Cu and barrier metal are removed by polishing through CMP and the surface is planarized. A single damascene structure is thus completed.

With the semiconductor device obtained in this manner, as with the first and second examples above, neither separation of the barrier metal at the MSQ interface nor scratches on the MSQ surface are acknowledged, which proves that the structure and the plasma treatment of the invention are effective for a process using MSQ.

FOURTH EXAMPLE

A single damascene process according to a fourth example of the invention will now be explained with reference to FIG. 18A through FIG. 21C. FIG. 18A through FIG. 21C are cross sections showing the step-by-step sequence of the single damascene process to which the structure and the plasma treatment of the invention are applied.

Figure 18A:
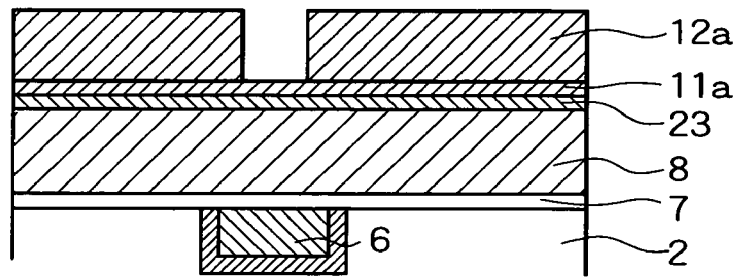
FIG. 18A through FIG. 18C are cross sections showing the step-by-step sequence of a single damascene process according to a fourth example of the invention.

Initially, as shown in FIG. 18A, a first etching stopper film 7, a first interlayer insulation film 8, and a first cap insulation film 23 are formed sequentially from bottom to top in certain thickness atop a lower layer wiring 6 through the CVD method, the plasma CVD method, etc. Then, after a first reflection preventing film 11a to be used to control reflection of exposing light is deposited on the first cap insulation film 23 in a thickness of approximately 50 nm, chemically amplified resist to be used to form a via hole pattern is applied thereon in a thickness of approximately 500 nm, which is subjected to exposure and development through ArF photolithography. A first resist pattern 12a is thereby formed.

A film that can achieve the effect of the plasma treatment of the invention can be any low dielectric film containing hydrophobic groups having a large molecular structure like MSQ that contains methyl groups, and it may be MHSQ, SiC, SiCN, SiOC, SiCOH, and OSG, etc. or a porous film of each. Also, the low dielectric film can be formed through any adequate means, such as CVD and coating.

This example will describe a case where SiOC is used as both the first interlayer insulation film 8 and a second interlayer insulation film 10. It should be appreciated, however, that the low dielectric film can be used as either of the first interlayer insulation film 8 and the second interlayer insulation film 10. Also, materials of films other than the low dielectric film are not especially limited. Any combination of materials such that can attain an etching selection ratio can be used, and materials can be selected from $SiO_2$, SiN, SiON, SiC, SiCN etc. as needed.

Figure 18B:
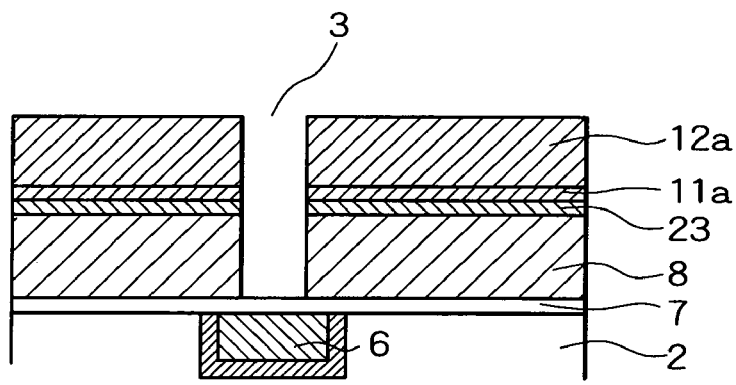

Then, as shown in FIG. 18B, the first reflection preventing film 11a, the first cap insulation film 23, and the first interlayer insulation film 8 are etched away sequentially through known dry etching, and a via hole 3 penetrating through these films is thereby formed. Subsequently, the first resist pattern 12a and the first reflection preventing film 11a are stripped away through oxygen plasma ashing and a wet treatment using an organic separating liquid, and a residue from the dry etching is removed.

Figure 18C:
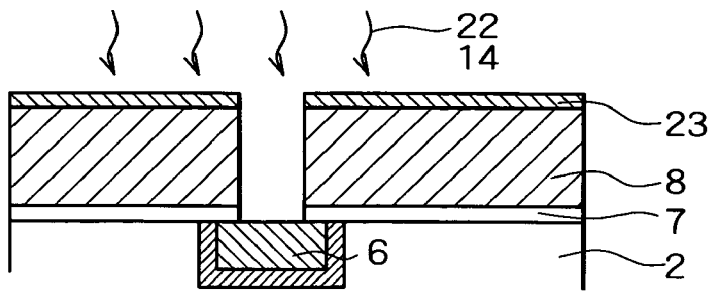

Then, as shown in FIG. 18C, after the exposed first etching stopper film 7 is removed through a dry etching method, the surface of the lower layer wiring 6 at the bottom of the via hole 3 is cleaned through sputtering using an Ar gas. Subsequently, the plasma treatment, which is the characteristic of the invention, is performed in situ, that is, within the same chamber and device used for Ar sputtering or in vacuo, that is while maintaining a vacuum. The method, the conditions, the gas kind, etc. of the plasma treatment are the same as those set forth in the first through third examples above.

Figure 19A:
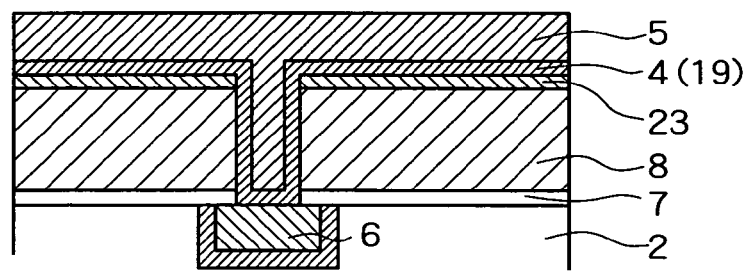
FIG. 19A through FIG. 19C are cross sections showing the step-by-step sequence of the single damascene process according to the fourth example of the invention.

This example will describe a case where the He plasma treatment is performed. After a dangling bond layer is formed through the He plasma treatment on the side surface where SiOC is exposed, as shown in FIG. 19A, a barrier metal 4, such as tantalum (Ta) and tantalum nitride (TaN), to be used to prevent diffusion of a wiring material and thereby to improve adhesion is formed, for example, in a thickness of approximately 30 nm in situ, that is, within the same chamber and device or in vacuo, that is, while maintaining a vacuum. Subsequently, a seed metal 19 of Cu to be used as the wiring material is formed in a film thickness of approximately 100 nm to make it easier for Cu-plating to be grown. In this instance, it is preferable to set the concentration of nitrogen in tantalum nitride (TaN) to a range from 10 atom % to 50 atom %.

Figure 19B:
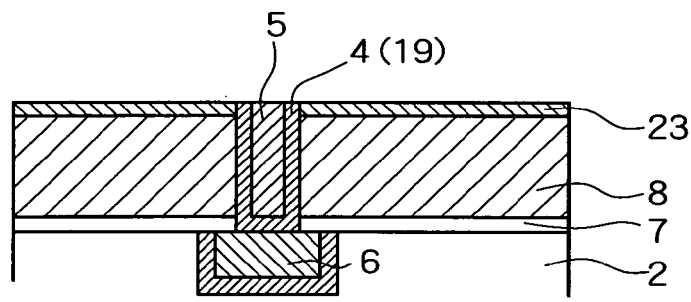
Figure 19C:
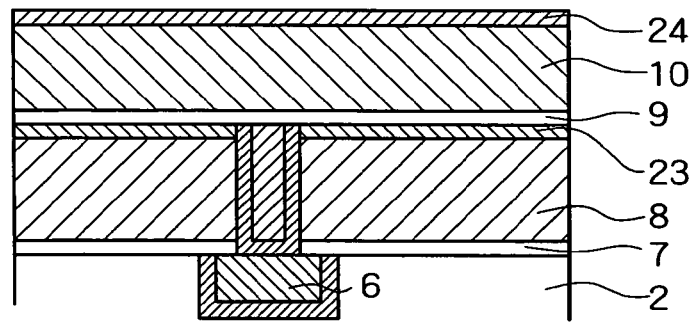

Then, after Cu to be used as a wiring material 5 is formed through plating and the via hole 3 is filled with Cu, as shown in FIG. 19B, extra Cu and barrier metal are removed by polishing through CMP and the surface is planarized. A via plug is thus completed. Subsequently, as shown in FIG. 19C, a second etching stopper film 9, a second interlayer insulation film 10, and a second cap insulation film 24 are formed sequentially from bottom to top in certain thickness for the use of the wiring.

Figure 20A:
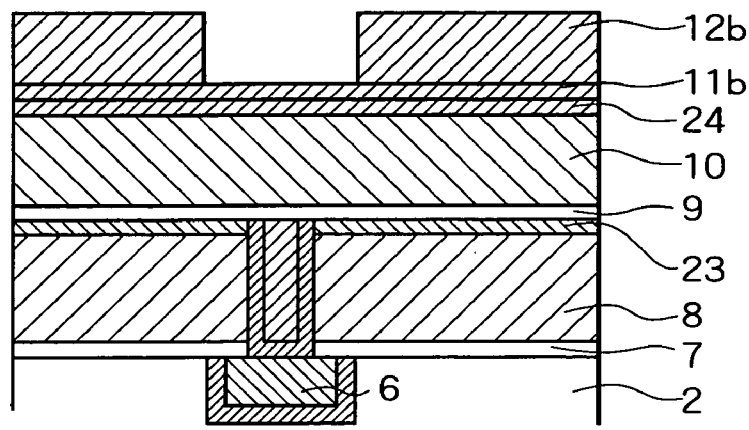
FIG. 20A and FIG. 20B are cross sections showing the step-by-step sequence of the single damascene process according to the fourth example of the invention.

Then, as shown in FIG. 20A, after a second reflection preventing film 11b to be used to control reflection of exposing light is deposited on the second cap insulation film 24 in a thickness of approximately 50 nm, chemically amplified resist to be used to form a via hole pattern is applied thereon in a thickness of approximately 400 nm, which is subjected to exposure and development through ArF photolithography. A second resist pattern 12b is thereby formed.

Figure 20B:
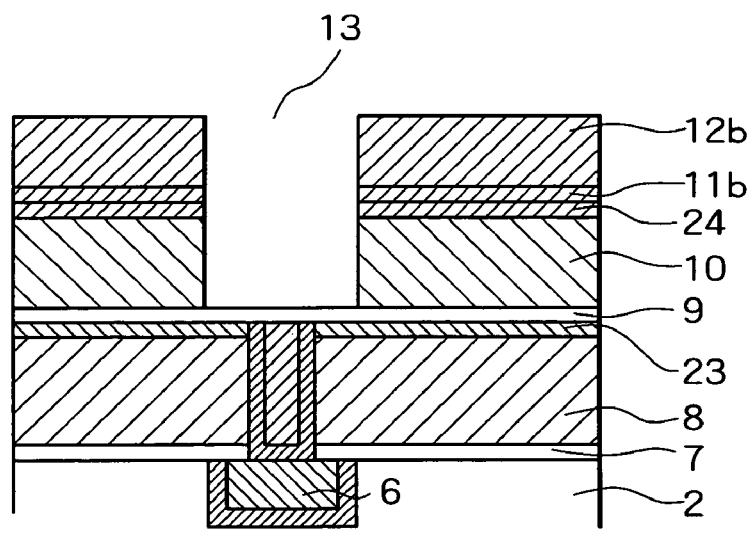

Then, as shown in FIG. 20B, the second reflection preventing film 11b, the second cap insulation film 24, and the second interlayer insulation film 10 are etched away sequentially through known dry etching, and a wiring trench pattern 13 penetrating through these films is thereby formed. Subsequently, the second resist pattern 12b and the second reflection preventing film 11b are stripped away through oxygen plasma ashing and a wet treatment using an organic separating liquid, and a residue from the dry etching is removed.

Figure 21A:
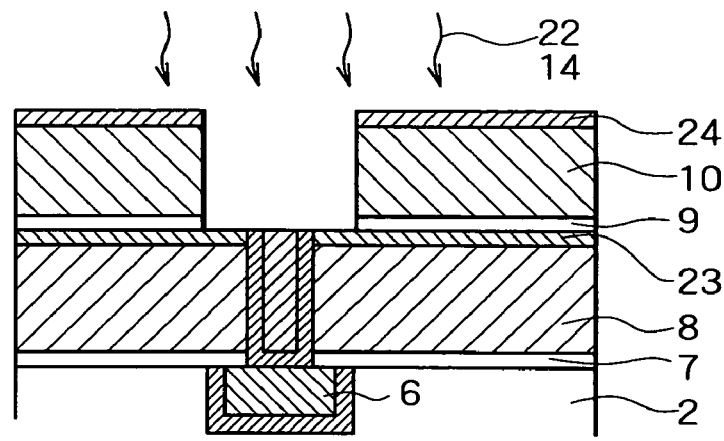
FIG. 21A through FIG. 21C are cross sections showing the step-by-step sequence of the single damascene process according to the fourth example of the invention.

Then, as shown in FIG. 21A, after the exposed second etching stopper film 9 is removed through a dry etching method, the surface of the via pattern at the bottom of the wiring trench pattern 13 is cleaned through sputtering using an Ar gas. Subsequently, the plasma treatment, which is the characteristic of the invention, is performed in situ, that is, within the same chamber and device used for Ar sputtering or in vacuo, that is while maintaining a vacuum. The method, the conditions, the gas kind, etc. are the same as those applied when forming the via plug.

Figure 21B:
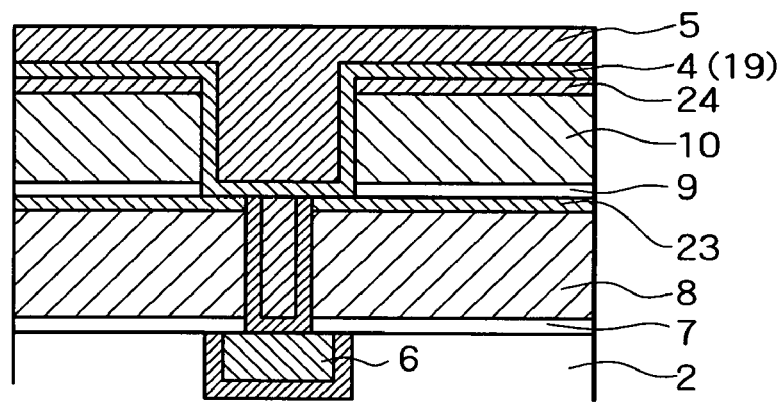

This example will describe a case where the He plasma treatment is performed. After a dangling bond layer is formed through the He plasma treatment on the side surface where SiOC is exposed, as shown in FIG. 21B, a barrier metal 4, such as tantalum (Ta) and tantalum nitride (TaN), to be used to prevent diffusion of a wiring material and thereby to improve adhesion is formed, for example, in a thickness of approximately 30 nm in situ, that is, within the same chamber and device or in vacuo, that is, while maintaining a vacuum. Subsequently, a seed metal 19 of Cu to be used as the wiring material is formed in a film thickness of approximately 100 nm to make it easier for Cu-plating to be grown. In this instance, it is preferable to set the concentration of nitrogen in tantalum nitride (TaN) to a range from 10 atom % to 50 atom %.

Figure 21C:
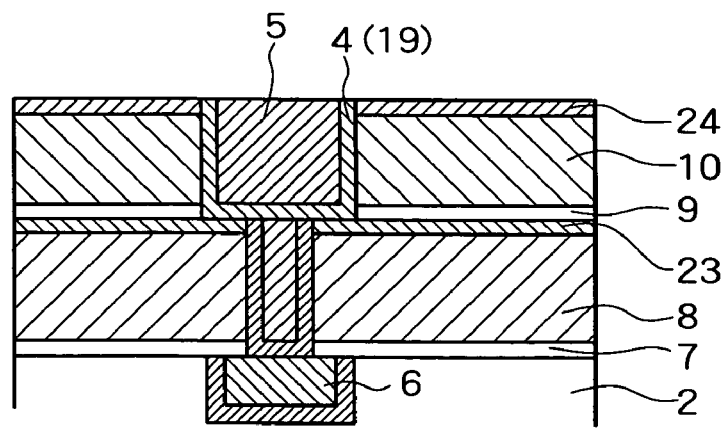

Then, after Cu to be used as a wiring material 5 is formed through plating and the wiring trench pattern 13 is filled with Cu, as shown in FIG. 21C, extra Cu and barrier metal are removed by polishing through CMP and the surface is planarized. A single damascene structure is thus completed.

With the semiconductor device obtained in this manner, as with the first through third examples above, separation of the barrier metal at the SiOC interface is not acknowledged, which proves that the structure and the plasma treatment of the invention are effective for a process using SiOC.

The examples above described the cases where the structure and the plasma treatment using a He/H$_2$ mixed gas or a He gas of the invention are applied to the via firs process and the dual hard mask process, which are included in the dual damascene process. It should be appreciated, however, that the invention is not limited to the examples above and can be applied to an arbitrary semiconductor process including the step of depositing a metal film, such as a barrier metal, on the exposed surface of a low dielectric film containing groups having a large molecular structure, such as methyl groups.

As has been described, according to the manufacturing method of a semiconductor device of the invention, in the damascene process including a step of depositing a metal film, such as a barrier metal, on a trench or a via hole formed in an insulation layer including a low dielectric film, such as MSQ, MHSQ, SiC, SiCN, SiOC, and SiCOH, it is possible to avoid a problem that the barrier metal is separated during CMP and scratches are left on the surface of the low dielectric insulation film, or film separation occurs at the barrier metal/low dielectric insulation film interface due to stress resulted from the multi-level interconnection.

The reason why is as follows. That is, by forming the structure of the invention through the plasma treatment using a He/H$_2$ mixed gas or the plasma treatment using a He gas with application of RF bias after the wiring trench pattern or the via hole is formed as pre-step of depositing the barrier metal, methyl groups on the surface of the low dielectric film, such as MSQ, are replaced by hydrogen, or decomposed to be hydrophilic through reformation, and it is thus possible to improve adhesion to an inorganic material.

What is claimed is:

1. A manufacturing method of a semiconductor device comprising the steps of:
    forming a low dielectric film including a bond of Si and C on a substrate;
    forming a via hole or a wiring groove in said low dielectric film;
    conducting a plasma treatment using He gas on an exposed surface of said low dielectric film including said via hole or wiring grove, while applying RF bias of 250 W to 400 W;
    forming a barrier metal on said exposed surface of said via hole or wiring groove formed in said low dielectric film, said barrier metal being made of tantalum nitride (TaN) on a side of said low dielectric film and tantalum (Ta) on the other side; and
    embedding a wiring material in said via hole or wiring groove, whose surfaces are covered by said barrier metal, formed in said low dielectric film.

2. A manufacturing method of a semiconductor device, comprising the steps of:
    forming at least a first interlayer insulation film and a second interlayer insulation film sequentially on a substrate in which a wiring pattern has been formed;
    forming a via hole penetrating through said first interlayer insulation film and said second interlayer insulation film using a first resist pattern formed on said second interlayer insulation film;
    removing said first resist pattern and then forming a trench pattern through etching of said second interlayer insulation film using a second resist pattern formed on said second interlayer insulation film;
    depositing a barrier metal on said second interlayer insulation film and on inner walls of said via hole and said trench pattern;
    depositing a wiring material and then embedding said wiring material in interiors of said via hole and said trench pattern; and
    removing extra portion of said wiring material and said barrier metal through CMP and surface is planarized, wherein:
    at least one of said first interlayer insulation film and said second interlayer insulation film is a low dielectric film having a bond of Si and C; and
    a plasma treatment is performed before said barrier metal is deposited, using He gas on an exposed surface of said low dielectric film including said via hole and said stretch pattern, while applying RF bias of 250 W to 400 W.

3. A manufacturing method of a semiconductor device, comprising the steps of:
    depositing at least a first interlayer insulation film, a second interlayer insulation film, and a hard mask material on a substrate in which a wiring pattern has been formed;

forming a hard mask through etching of said hard mask material using a first resist pattern formed on said hard mask material;

forming a via hole penetrating through said first interlayer insulation film and said second interlayer insulation film using a second resist pattern formed on said hard mask;

removing said second resist pattern and then forming a trench pattern through etching of said second interlayer insulation film using said hard mask;

depositing a barrier metal on said second interlayer insulation film and on inner walls of said via hole and said trench pattern;

depositing a wiring material and then embedding said wiring material in interiors of said via hole and said trench pattern; and removing extra portion of said wiring material and said barrier metal through CMP and surface is planarized, wherein:

at least one of said first interlayer insulation film, said second interlayer insulation film, and said hard mask is a low dielectric film having a bond of Si and C; and a plasma treatment is performed before said barrier metal is deposited, using He gas on an exposed surface of said low dielectric film including said via hole and said stretch pattern, while applying RF bias of 250 W to 400 W.

4. A manufacturing method of a semiconductor device comprising the steps of:

forming a low dielectric film including a bond of Si and C on a substrate;

forming a via hole or a wiring groove in said low dielectric film;

conducting a plasma treatment using a mixed gas of He and $H_2$ on an exposed surface of said low dielectric film including said via hole or wiring groove;

forming a barrier metal on said exposed surface of said via hole or wiring groove formed in said low dielectric film, said barrier metal being made of tantalum nitride (TaN) on a side of said low dielectric film and tantalum (Ta) on the other side; and embedding a wiring material in said via hole or wiring groove, whose surfaces are covered by said barrier metal, formed in said low dielectric film.

5. The manufacturing method of a semiconductor device as claimed in claim 4, wherein the ratio of $H_2$ gas to said mixed gas is 1 to 10%.

6. A manufacturing method of a semiconductor device, comprising the steps of:

forming at least a first interlayer insulation film and a second interlayer insulation film sequentially on a substrate in which a wiring pattern has been formed;

forming a via hole penetrating through said first interlayer insulation film and said second interlayer insulation film using a first resist pattern formed on said second interlayer insulation film;

removing said first resist pattern and then forming a trench pattern through etching of said second interlayer insulation film using a second resist pattern formed on said second interlayer insulation film;

depositing a barrier metal on said second interlayer insulation film and on inner walls of said via hole and said trench pattern, said barrier metal being made of tantalum nitride (TaN) on said via hole and said trench pattern;

depositing a wiring material and then embedding said wiring material in interiors of said via hole and said trench pattern; and removing extra portion of said wiring material and said barrier metal through CMP and surface is planarized, wherein:

at least one of said first interlayer insulation film and said second interlayer insulation film is a low dielectric film having a bond of Si and C: and a plasma treatment is performed before said barrier metal is deposited, using a mixed gas of He and $H_2$ on an exposed surface of said low dielectric film including said via hole and said trench pattern.

7. The manufacturing method of a semiconductor device as claimed in claim 5, wherein the ratio of $H_2$ gas to said mixed gas is 1 to 10%.

8. A manufacturing method of a semiconductor device, comprising the steps of:

depositing at least a first interlayer insulation film, a second interlayer insulation film, and a hard mask material on a substrate in which a wiring pattern has been formed;

forming a hard mask through etching of said hard mask material using a first resist pattern formed on said hard mask material;

forming a via hole penetrating through said first interlayer insulation film and said second interlayer insulation film using a second resist pattern formed on said hard mask;

removing said second resist pattern and then forming a trench pattern through etching of said second interlayer insulation film using said hard mask;

depositing a barrier metal on said second interlayer insulation film and on inner walls of said via hole and said trench pattern, said barrier metal being made of tantalum nitride (TaN) on a side of said low dielectric film and tantalum (Ta) on the other side;

depositing a wiring material and then embedding said wiring material in interiors of said via hole and said trench pattern; and removing extra portion of said wiring material and said barrier metal through CMP and surface is planarized, wherein:

at least one of said first interlayer insulation film, said second interlayer insulation film, and said hard mask is a low dielectric film having a bond of Si and C: and a plasma treatment is performed before said barrier metal is deposited, using a mixed gas of He and $H_2$ on an exposed surface of said low dielectric film including said via hole and said trench pattern.

9. The manufacturing method of a semiconductor device as claimed in claim 7, wherein the ratio of $H_2$ gas to said mixed gas is 1 to 10%.

* * * * *